(12) United States Patent
Hwang et al.

(10) Patent No.: US 12,713,984 B2
(45) Date of Patent: Aug. 18, 2026

(54) SEMICONDUCTOR PACKAGE

(71) Applicant: SAMSUNG ELECTRONICS CO., LTD., Suwon-si (KR)

(72) Inventors: Hyeonjeong Hwang, Suwon-si (KR); Kyoung Lim Suk, Suwon-si (KR); Inhyung Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 18/226,180

(22) Filed: Jul. 25, 2023

(65) Prior Publication Data

US 2024/0203961 A1 Jun. 20, 2024

(30) Foreign Application Priority Data

Dec. 15, 2022 (KR) ........................ 10-2022-0175956

(51) Int. Cl.
*H10W 70/685* (2026.01)
*H10W 74/01* (2026.01)
(Continued)

(52) U.S. Cl.
CPC ......... *H10W 90/00* (2026.01); *H10W 70/685* (2026.01); *H10W 74/01* (2026.01);
(Continued)

(58) Field of Classification Search
CPC ..... H01L 25/16; H01L 21/56; H01L 23/3128; H01L 23/3135; H01L 23/49822; H01L 24/05; H01L 24/32; H01L 25/162; H01L 24/13; H01L 24/16; H01L 2224/05624; H01L 2224/05647; H01L 2224/13111; H01L 2224/13113; H01L 2224/13116; H01L 2224/13139; H01L 2224/16227; H01L 2224/32265; H01L 2924/1815; H01L 2924/19041; H01L 2924/19104; H01L 2924/19106; H01L 2221/68345;
(Continued)

(56) References Cited

U.S. PATENT DOCUMENTS

| | | | |
|---|---|---|---|
| 8,357,560 | B2 | 1/2013 | Pyo et al. |
| 10,050,016 | B2 | 8/2018 | Lee et al. |

(Continued)

FOREIGN PATENT DOCUMENTS

| | | |
|---|---|---|
| KR | 10-0846569 B1 | 7/2008 |
| KR | 10-2091040 B1 | 3/2020 |

(Continued)

*Primary Examiner* — Elias Ullah
(74) *Attorney, Agent, or Firm* — Muir Patent Law, PLLC

(57) ABSTRACT

A semiconductor package may include a first redistribution substrate, a semiconductor chip disposed on the first redistribution substrate, a mold layer covering the semiconductor chip and including a first opening exposing a portion of a top surface of the semiconductor chip, a first passive device disposed on the portion of the top surface of the semiconductor chip exposed by the first opening, an insulating pattern filling the first opening and covering at least a portion of the first passive device, and a second redistribution substrate disposed on the mold layer. The first passive device may be spaced apart from the mold layer, with the insulating pattern interposed therebetween.

20 Claims, 13 Drawing Sheets

(51) Int. Cl.
*H10W 74/10* (2026.01)
*H10W 90/00* (2026.01)
*H10W 72/20* (2026.01)
*H10W 72/90* (2026.01)

(52) U.S. Cl.
CPC ........ *H10W 74/117* (2026.01); *H10W 74/121* (2026.01); *H10W 72/252* (2026.01); *H10W 72/952* (2026.01); *H10W 74/10* (2026.01); *H10W 90/724* (2026.01); *H10W 90/738* (2026.01)

(58) Field of Classification Search
CPC ........... H01L 21/6835; H01L 23/49816; H01L 23/5389; H01L 24/20; H01L 24/04; H01L 25/18; H01L 2224/02331; H01L 2224/02333; H01L 2224/0235; H01L 2224/02373; H01L 2224/02379; H01L 2224/02381; H01L 2225/1041
See application file for complete search history.

(56) References Cited

U.S. PATENT DOCUMENTS

| | | | |
|---|---|---|---|
| 10,424,563 B2 | 9/2019 | Lin et al. | |
| 10,788,370 B2 | 9/2020 | Herrmann et al. | |
| 10,818,604 B2 | 10/2020 | Kang et al. | |
| 2017/0125379 A1* | 5/2017 | Chen | H01L 23/3142 |
| 2020/0273801 A1 | 8/2020 | Kim et al. | |
| 2021/0098408 A1 | 4/2021 | Ting et al. | |
| 2022/0130815 A1 | 4/2022 | Huang et al. | |

FOREIGN PATENT DOCUMENTS

| | | |
|---|---|---|
| KR | 20200111003 A | 9/2020 |
| KR | 20210032709 A | 3/2021 |
| KR | 20220150491 A | 11/2022 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0175956, filed on Dec. 15, 2022, in the Korean Intellectual Property Office, the entire contents of which are hereby incorporated by reference.

BACKGROUND

1. Field

The present disclosure relates to a semiconductor package, and in particular, a semiconductor package including a passive device.

2. Description of the Related Art

A semiconductor package is configured to easily use an integrated-circuit chip as a part of an electronic product. In general, the semiconductor package includes a printed circuit board (PCB) and a semiconductor chip, which is mounted on the PCB and is electrically connected to the PCB using bonding wires or bumps. With development of the electronic industry, various studies are being conducted to provide a highly-reliable, highly-integrated, and small-sized semiconductor package.

SUMMARY

An embodiment provides a semiconductor package with improved mechanical and electric characteristics.

According to an embodiment, a semiconductor package may include a first redistribution substrate, a semiconductor chip on the first redistribution substrate, a mold layer covering the semiconductor chip and including a first opening exposing a portion of a top surface of the semiconductor chip, a first passive device on the portion of the top surface of the semiconductor chip exposed by the first opening, an insulating pattern filling the first opening and covering at least a portion of the first passive device, and a second redistribution substrate on the mold layer. The first passive device may be spaced apart from the mold layer, with the insulating pattern interposed therebetween.

According to an embodiment, a semiconductor package may include a first redistribution substrate, a semiconductor chip on the first redistribution substrate, a mold layer covering the semiconductor chip and including an opening exposing a portion of a top surface of the semiconductor chip, a first passive device on the portion of the top surface of the semiconductor chip exposed by the opening, the first passive device including a first conductive terminal, a second conductive terminal, and a first insulating material between the first and second conductive terminals, an insulating pattern filling the opening and covering at least a portion of the first passive device, and a second redistribution substrate on the mold layer. The second redistribution substrate may include insulating layers and redistribution patterns and first terminal wiring patterns, which are provided in the insulating layers. The first and second conductive terminals may be coupled to the first terminal wiring patterns, respectively.

According to an embodiment, a semiconductor package may include a lower package and an upper package on the lower package. The lower package may include a first redistribution substrate, a first semiconductor chip on the first redistribution substrate, a conductive post on the first redistribution substrate and laterally spaced apart from the first semiconductor chip, a first mold layer covering the first semiconductor chip and including a first opening, which exposes a portion of a top surface of the first semiconductor chip, a passive device on the portion of the top surface of the first semiconductor chip exposed by the first opening, and an insulating pattern filling the first opening of the first mold layer and covering at least a portion of the passive device. The upper package may include a second redistribution substrate, the second redistribution substrate including redistribution patterns and terminal wiring patterns, a second semiconductor chip on the second redistribution substrate, and a second mold layer covering the second semiconductor chip. The passive device may be spaced apart from the first mold layer, with the insulating pattern interposed therebetween, and the terminal wiring patterns may be coupled to the passive device.

BRIEF DESCRIPTION OF THE DRAWINGS

Features will become apparent to those of skill in the art by describing in detail exemplary embodiments with reference to the attached drawings in which:

FIG. 1 is a sectional view illustrating a semiconductor package according to an embodiment.

FIG. 3 is a sectional view illustrating a semiconductor package according to an embodiment.

FIG. 5 is a sectional view illustrating a semiconductor package according to an embodiment.

FIGS. 7 to 11 are sectional views illustrating a method of fabricating a semiconductor package, according to an embodiment.

DETAILED DESCRIPTION

Figure 2A:
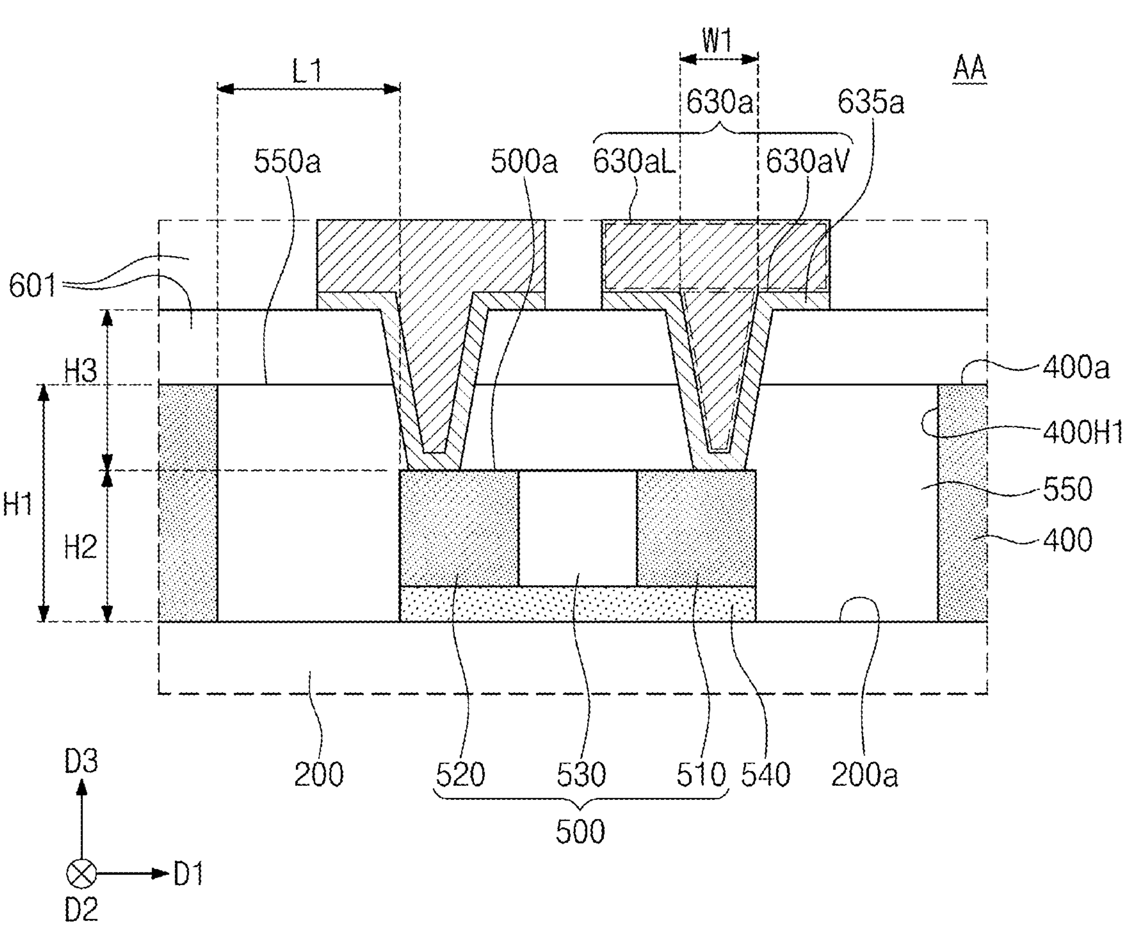
FIG. 2A is an enlarged sectional view illustrating a portion 'AA' of FIG. 1.

Example embodiments will now be described more fully with reference to the accompanying drawings, in which example embodiments are shown. Like reference numerals in the drawings denote like elements, and thus their description will not be repeated.

As used herein, the terms "first," "second," and the like are merely for identification, and are not intended to imply or require sequential inclusion (e.g., a third element and a fourth element may be described without implying or requiring the presence of a first element or second element)

Figure 1:
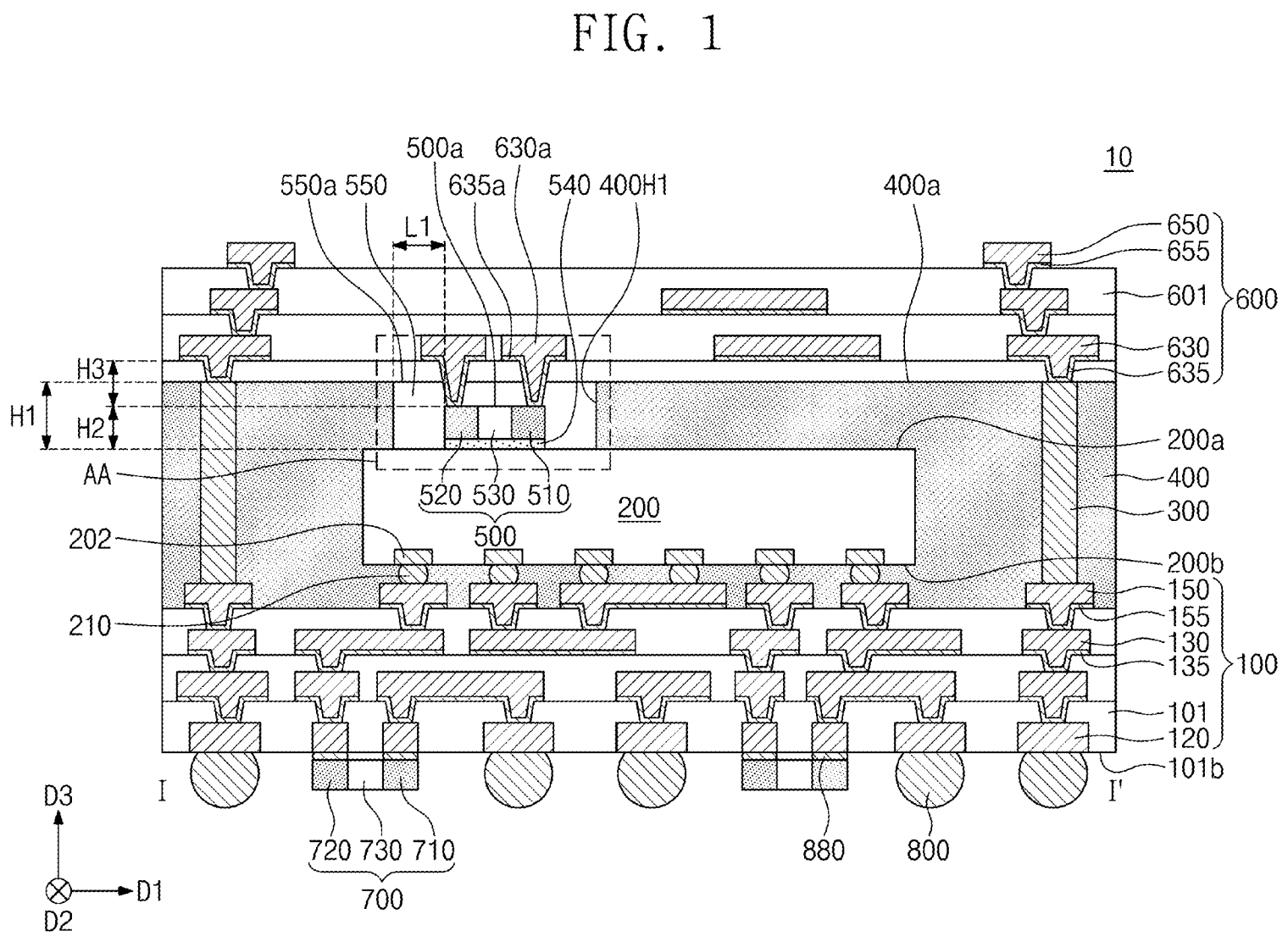

FIG. 1 is a sectional view illustrating a semiconductor package according to an embodiment. FIG. 2A is an enlarged sectional view illustrating a portion 'AA' of FIG. 1.

Referring to FIG. 1, a semiconductor package 10 may include a first redistribution substrate 100, a first semiconductor chip 200, a conductive post 300, a first mold layer 400, a first passive device 500, a first insulating pattern 550, a second redistribution substrate 600, a second passive device 700, and outer connection terminals 800.

The first redistribution substrate 100 may include a first insulating layer 101, under-bump patterns 120, first redistribution patterns 130, first seed patterns 135, first seed pads 155, and first redistribution pads 150. The first redistribution substrate 100 may be a re-distribution layer or a printed circuit board.

The first insulating layer 101 may be formed of or include an organic material (e.g., a photo-imageable dielectric (PID) material). The PID material may be a polymer. For example, the PID material may include at least one of photo-imageable polyimide, polybenzoxazole, phenol-based polymers, or benzocyclobutene-based polymers. In an embodiment, a plurality of the first insulating layers 101 may be provided. The number of the stacked first insulating layers 101 may be variously changed. In an embodiment, the first insulating layers 101 may be formed of or include the same material. There may be no observable interface between adjacent ones of the first insulating layers 101.

A first direction D1 may be parallel to a bottom surface 101*b* of the lowermost one of the first insulating layers 101. A second direction D2 may be parallel to the bottom surface 101*b* of the lowermost one of the first insulating layers 101 and may be perpendicular to the first direction D1. A third direction D3 may be perpendicular to the bottom surface 101*b* of the lowermost one of the first insulating layers 101.

The under-bump patterns 120 may be provided in the lowermost one of the first insulating layers 101. Bottom surfaces of the under-bump patterns 120 may be exposed from the lowermost one of the first insulating layers 101. The under-bump patterns 120 may serve as pads of the outer connection terminals 800. The under-bump patterns 120 may be laterally spaced apart from each other and may be electrically disconnected from each other. Here, the expression "two elements are laterally spaced apart from each other" may indicate that the elements are horizontally spaced apart from each other. The term "horizontal" may be used to represent a direction parallel to the first or second direction D1 or D2. A bottom surface of the first redistribution substrate 100 may be composed of the bottom surface 101*b* of the lowermost one of the first insulating layers 101 and the bottom surfaces of the under-bump patterns 120. The under-bump patterns 120 may be formed of or include at least one of metallic materials (e.g., copper).

The first redistribution patterns 130 may be provided on and electrically connected to the under-bump patterns 120. The first redistribution patterns 130 may be laterally spaced apart from each other and may be electrically separated from each other. The first redistribution patterns 130 may be formed of or include at least one of metallic materials (e.g., copper). An electrical connection with the first redistribution substrate 100 may mean an electrical connection with at least one of the first redistribution patterns 130 and the under-bump patterns 120.

Each of the first redistribution patterns 130 may include a first via portion and a first line portion. The first via portion may be provided in a corresponding one of the first insulating layers 101. The first line portion may be provided on the first via portion and may be connected to the first via portion without an interface therebetween. A width of the first line portion may be larger than a width of the first via portion. The first line portion may extend to a region on a top surface of the corresponding first insulating layer 101. In the present specification, the via portion may be an element for vertical interconnection, and the line portion may be an element for horizontal interconnection. Herein, the term "vertical" may be used to represent a direction parallel to the third direction D3.

The first seed patterns 135 may be disposed on bottom surfaces of the first redistribution patterns 130, respectively. For example, each of the first seed patterns 135 may cover bottom and side surfaces of the first via portion and a bottom surface of the first line portion of a corresponding one of the first redistribution patterns 130. Each of the first seed patterns 135 may not be extended to a side surface of the first line portion of a corresponding one of the first redistribution patterns 130. The first seed patterns 135 may be formed of or include at least one of metallic materials, which are different from the under-bump patterns 120 and the first redistribution patterns 130. For example, the first seed patterns 135 may be formed of or include at least one of copper, titanium, and/or alloys thereof. The first seed patterns 135 may be used as barrier layers and may prevent a material that is included in the first redistribution patterns 130, from being diffused.

The first redistribution pads 150 may be disposed on the first redistribution patterns 130 and may be coupled to the first redistribution patterns 130. The first redistribution pads 150 may be laterally spaced apart from each other. The first redistribution pads 150 may be respectively coupled to the under-bump patterns 120 through the first redistribution patterns 130. Since the first redistribution patterns 130 are provided, at least one of the first redistribution pads 150 may not be vertically aligned to the under-bump pattern 120 that is electrically connected to the first redistribution pad 150. Accordingly, the disposition of the first redistribution pads 150 may be more freely designed. The number of the first redistribution patterns 130 that are stacked between the under-bump patterns 120 and the first redistribution pads 150, is not limited to the illustrated example and may be variously changed.

The first redistribution pads 150 may be provided in and on the uppermost one of the first insulating layers 101. A lower portion of each of the first redistribution pads 150 may be disposed in the uppermost one of the first insulating layers 101. An upper portion of each of the first redistribution pads 150 may extend to a region on a top surface of the uppermost one of the first insulating layers 101. The first redistribution pads 150 may be formed of or include at least one of metallic materials (e.g., copper). The first redistribution pads 150 may further include nickel, gold, and/or alloys thereof.

The first seed pads 155 may be provided on bottom surfaces of the first redistribution pads 150, respectively. The first seed pads 155 may be respectively provided between the first redistribution pads 150 and the first redistribution patterns 130 and may extend into regions between the uppermost one of the first insulating layers 101 and the first redistribution pads 150. The first seed pads 155 may include at least one of metallic materials that are different from the first redistribution pads 150.

The first semiconductor chip 200 may be mounted on a top surface of the first redistribution substrate 100. As an example, the first semiconductor chip 200 may be a logic chip or a buffer chip. The logic chip may include an application specific integrated circuit (ASIC) chip or an application processor (AP) chip. The ASIC chip may include application specific integrated circuit (ASIC). As another example, the logic chip may include a central processing unit (CPU) or a graphic processing unit (GPU). As other example, the first semiconductor chip 200 may be a memory chip.

A first chip pad 202 may be provided on a bottom surface 200*b* of the first semiconductor chip 200. In an embodiment, a plurality of first chip pads 202 may be provided. The first chip pad 202 may be formed of or include at least one of metallic materials (e.g., copper and aluminum).

A first connection terminal 210 may be provided between the first chip pad 202 and the first redistribution pad 150. The first connection terminal 210 may be in contact with the first chip pad 202 and the first redistribution pad 150. The first connection terminal 210 may electrically connect the first semiconductor chip 200 to the first redistribution substrate 100 through the first chip pad 202 and the first redistribution pad 150. The first connection terminal 210 may be formed of or include at least one of solder materials. For example, the solder materials may include tin, bismuth, lead, silver, or alloys thereof.

The conductive post 300 may be provided on the first redistribution substrate 100 to be spaced apart from the first semiconductor chip 200 in the first direction D1 or the second direction D2. In an embodiment, a plurality of conductive posts 300 may be provided. A top surface of the conductive post 300 may be disposed at a level higher than a top surface 200*a* of the first semiconductor chip 200. The conductive post 300 may be disposed on and directly coupled to a corresponding one of the first redistribution pads 150. Accordingly, the conductive post 300 may be coupled to the first redistribution substrate 100. The conductive post 300 may be electrically connected to the outer connection terminals 800 and the first semiconductor chip 200 through the first redistribution substrate 100. The conductive post 300 may have a circular pillar shape. However, the shape of the conductive post 300 may be variously changed. The conductive post 300 may be metal posts. For example, the conductive post 300 may be formed of or include copper or tungsten.

The first mold layer 400 may be disposed on the first redistribution substrate 100 to cover a side surface of the conductive post 300. The first mold layer 400 may cover at least a portion of the top surface of the first redistribution substrate 100 and at least a portion of the first redistribution pads 150. The first mold layer 400 may extend to a space between the first semiconductor chip 200 and the first redistribution pads 150 to hermetically seal the first connection terminal 210. Accordingly, an under-fill pattern (not shown) may be interposed between the first redistribution substrate 100 and the first redistribution pads 150 to hermetically sear the first connection terminal 210. The first mold layer 400 may cover the top surface 200*a* of the first semiconductor chip 200 and may include a first opening 400H1 exposing at least a portion of the top surface 200*a* of the first semiconductor chip 200. In other words, the at least a portion of the top surface 200*a* of the first semiconductor chip 200 may be exposed to the outside through the first opening 400H1 of the first mold layer 400. A distance from the top surface 200*a* of the first semiconductor chip 200 to a top surface 400*a* of the first mold layer 400 in the third direction D3 may be a first height H1. The first height H1 may be equal to a height of the first insulating pattern 550, as will be described below. The first height H1 may range from 1 μm to 20 μm. The top surface 400*a* of the first mold layer 400 may be coplanar with the top surfaces of the conductive posts 300. A side surface of the first mold layer 400 may be vertically aligned to a side surface of the first redistribution substrate 100. The first mold layer 400 may be formed of or include at least one of insulating polymers (e.g., epoxy-based molding compounds).

The first passive device 500 may be provided on the top surface 200*a* of the first semiconductor chip 200 exposed by the first opening 400H1 of the first mold layer 400. In other words, the first passive device 500 may be provided in the first opening 400H1 of the first mold layer 400. The first passive device 500 may be spaced apart from the first mold layer 400. The first passive device 500 may be, for example, a capacitor. As another example, the first passive device 500 may be an inductor or a resistor. The first passive device 500 may include a first conductive terminal 510, a second conductive terminal 520, and a first insulating material 530. Each of the first and second conductive terminals 510 and 520 may be an electrode of the first passive device 500. The second conductive terminal 520 may be spaced apart from the first conductive terminal 510. The first insulating material 530 may be interposed between the first and second conductive terminals 510 and 520.

However, it is to be understood that the structure and elements of the first passive device 500 may not be limited to the illustrated example and may be changed in various ways. In an embodiment, the first passive device 500 may include an integrated-stack capacitor (ISC). In this case, a stack (not shown) may be disposed in the first insulating material 530. The stack may include a plurality of conductive layers and a plurality of dielectric layers, which are respectively disposed between the conductive layers. In some implementations, the first passive device 500 may include an active device, despite its name. Whether the device 500 is passive or active may depend on the design of the semiconductor package to be fabricated.

A first adhesive film 540 may be provided between the first passive device 500 and the first semiconductor chip 200. The first adhesive film 540 may be used to fasten the first passive device 500 to a top surface of the first semiconductor chip 200. The first adhesive film 540 may include a die attach film (DAF).

The first passive device 500 may have a second height H2. The second height H2 may be a distance from the top surface 200*a* of the first semiconductor chip 200 to a top surface 500*a* of the first passive device 500 in the third direction D3. The second height H2 may be smaller than or equal to the first height H1.

The first insulating pattern 550 may be provided in the first opening 400H1 of the first mold layer 400. The first insulating pattern 550 may cover at least a portion of the top surface 200*a* of the first semiconductor chip 200 exposed by the first opening 400H1. The first insulating pattern 550 may cover an inner side surface of the first mold layer 400 defining the first opening 400H1. The first insulating pattern 550 may cover the top surface 500*a* and the side surface of the first passive device 500 and the side surface of the first adhesive film 540. A top surface 550*a* of the first insulating pattern 550 may be located at a level that is higher than or equal to the top surface 500*a* of the first passive device 500. The top surface 550*a* of the first insulating pattern 550 may be located at the same vertical level as the top surface 400*a* of the first mold layer 400. The first insulating pattern 550 may be formed of or include a material different from the first mold layer 400. The first insulating pattern 550 may be formed of or include at least one of photo-imageable dielectric (PID) materials.

The second redistribution substrate 600 may be provided on the conductive post 300, the first mold layer 400, and the first insulating pattern 550. The second redistribution substrate 600 may be disposed on the first semiconductor chip 200 and may be vertically spaced apart from the top surface 200*a* of the first semiconductor chip 200. The second redistribution substrate 600 may be electrically connected to the conductive posts 300.

The second redistribution substrate 600 may include a second insulating layer 601, second redistribution patterns 630, second seed patterns 635, and second redistribution pads 650. The second insulating layer 601 may include a plurality of second insulating layers 601. The second insulating layers 601 may be stacked on the first mold layer 400. The second insulating layers 601 may be formed of or include at least one of photo-imageable dielectric (PID) materials. In an embodiment, the second insulating layers 601 may be formed of or include the same material. In this case, there may be no observable interface between adjacent ones of the second insulating layers 601. The number of the second insulating layers 601 may be variously changed.

For convenience in illustration, the first insulating pattern 550 and the lowermost one of the second insulating layers 601 are illustrated as forming an observable interface therebetween. However, in some implementations, the first insulating pattern 550 and the lowermost one of the second insulating layers 601 may be formed to constitute a single object. In this case, the lowermost one of the second insulating layers 601 may be formed of or include the same material as the first insulating pattern 550.

The second redistribution patterns 630 may be provided on the conductive posts 300. The second redistribution patterns 630 may be coupled to the conductive posts 300. Each of the second redistribution patterns 630 may include a second via portion and a second line portion. The second via portion may be provided in a corresponding one of the second insulating layers 601. The second line portion may be provided on the second via portion and may be connected to the second via portion without an interface therebetween. The second line portion of each of the second redistribution patterns 630 may extend to a region on a top surface of a corresponding one of the second insulating layers 601. The second redistribution patterns 630 may be formed of or include at least one of metallic materials (e.g., copper).

The second seed patterns 635 may be disposed on bottom surfaces of the second redistribution patterns 630, respectively. For example, each of the second seed patterns 635 may be provided on bottom and side surfaces of the second via portion of a corresponding one of the second redistribution patterns 630 and may extend to a bottom surface of the second line portion. The second seed patterns 635 may be formed of or include at least one of metallic materials that are different from the conductive posts 300 and the second redistribution patterns 630. The second seed patterns 635 may be used as barrier layers and may prevent a material that is included in the second redistribution patterns 630, from being diffused.

First terminal wiring patterns 630*a* may be provided on the first passive device 500. The first terminal wiring patterns 630*a* may be provided to penetrate at least a portion of the second insulating layers 601. The first terminal wiring patterns 630*a* may be inserted into the first insulating pattern 550 and may be coupled to the first passive device 500. In detail, each of the first terminal wiring patterns 630*a* may be coupled to a corresponding one of the first and second conductive terminals 510 and 520. Two of the first terminal wiring patterns 630*a*, which are respectively coupled to the first and second conductive terminals 510 and 520, may not be electrically connected to each other. The first passive device 500 may be electrically connected to the second redistribution substrate 600 through the first terminal wiring patterns 630*a*.

First seed terminal patterns 635*a* may be disposed on bottom surfaces of the first terminal wiring patterns 630*a*, respectively. The first seed terminal patterns 635*a* may be formed of or include at least one of metallic materials different from the conductive posts 300 and the first terminal wiring patterns 630*a*. The first seed terminal patterns 635*a* may be used as barrier layers and may prevent a material that is included in the first terminal wiring patterns 630*a* from being diffused.

The first terminal wiring patterns 630*a* may be formed of or include the same material as the second redistribution patterns 630. The first seed terminal patterns 635*a* may be formed of or include the same material as the second seed patterns 635.

The first conductive terminal 510 may be electrically connected to a corresponding one of the second redistribution patterns 630 through one of the first terminal wiring patterns 630*a*. The second conductive terminal 520 may be electrically connected to a corresponding one of the second redistribution patterns 630 through another one of the first terminal wiring patterns 630*a*. The first and second conductive terminals 510 and 520 may be electrically connected to the first redistribution pads 150, respectively, which vertically overlap the first semiconductor chip 200 through the conductive post 300 and the first redistribution patterns 130. Accordingly, a voltage that is output from the first passive device 500 may be supplied to the first semiconductor chip 200 connected thereto.

The second redistribution pads 650 may be disposed on and coupled to the second redistribution patterns 630. The second redistribution pads 650 may be laterally spaced apart from each other. Lower portions of the second redistribution pads 650 may be provided in the uppermost one of the second insulating layers 601. Upper portions of the second redistribution pads 650 may extend to a region on a top surface of the uppermost one of the second insulating layers 601. The second redistribution pads 650 may be formed of or include at least one of metallic materials (e.g., copper).

The second redistribution pads 650 may be coupled to the conductive posts 300 through the second redistribution patterns 630. When the second redistribution patterns 630 are provided, the second redistribution pads 650 may be provided such that at least one of them is not aligned to the conductive post 300 that is electrically connected thereto. Accordingly, the disposition of the second redistribution pads 650 may be more freely designed. The number of the second redistribution patterns 630 that are stacked between each pair of the conductive post 300 and the second redistribution pad 650 is not limited to the illustrated example and may be variously changed. For example, one, two or three or more of the second redistribution patterns 630 may be provided between each pair of the conductive post 300 and the second redistribution pad 650.

The second redistribution substrate 600 may further include second seed pads 655. The second seed pads 655 may be interposed between the uppermost one of the second redistribution patterns 630 and the second redistribution pads 650. The second seed pads 655 may include at least one of metallic materials.

The second passive device 700 may be mounted on the bottom surface of the first redistribution substrate 100. In an embodiment, a plurality of second passive devices 700 may be provided. The second passive device 700 may be, for example, a capacitor. As another example, the second passive device 700 may be an inductor or a resistor. The second passive device 700 may include a third conductive terminal 810, a fourth conductive terminal 820, and an insulating material 830. Each of the third and fourth conductive terminals 810 and 820 may be an electrode of the second passive device 700. The fourth conductive terminal 820 may be spaced apart from the third conductive terminal 810. The insulating material 830 may be provided between the third conductive terminal 810 and the fourth conductive terminal 820.

However, it is to be understood that the structure and elements of the second passive device 700 may not be limited to the illustrated example and may be changed in various ways. As an example, the second passive device 700 may include an integrated-stack capacitor (ISC). In this case, a stack (not shown) may be disposed in the insulating material 830. The stack may include a plurality of conductive layers and a plurality of dielectric layer, that are respectively disposed between the conductive layers. In an embodiment, the second passive device 700 may include an active device, despite its name. Whether the device is passive or active may depend on the design of the semiconductor package to be fabricated.

The outer connection terminals 800 may be disposed on the bottom surface of the first redistribution substrate 100. For example, the outer connection terminals 800 may be disposed on the bottom surfaces of the under-bump patterns 120, respectively, and may be coupled to the under-bump patterns 120, respectively. The outer connection terminals 800 may be electrically connected to the first redistribution patterns 130 through the under-bump patterns 120. The outer connection terminals 800 may be laterally spaced apart from each other and may be electrically disconnected from each other. The outer connection terminals 800 may be laterally spaced apart from the second passive device 700. The lowermost surfaces of the outer connection terminals 800 may be located at a level lower than a bottom surface of the second passive device 700. Accordingly, in the case where the outer connection terminals 800 of the semiconductor package 10 are coupled to a board, the second passive device 700 may be spaced apart from the board. Thus, the semiconductor package 10 may be securely mounted on the board. Herein, the term "level" of an element may refer to a relative level of the element in a vertical direction. A difference between levels of two elements may be measured in the third direction D3.

The outer connection terminals 800 may be formed of or include at least one of solder materials. For example, the solder materials may include tin, bismuth, lead, silver, or alloys thereof. The outer connection terminals 800 may include a signal solder ball, a ground solder ball, and a power solder ball.

Solder connecting portions 880 may be respectively provided between the third conductive terminal 810 and the corresponding under-bump pattern 120 and may be located between the fourth conductive terminal 820 and the corresponding under-bump pattern 120. The solder connecting portions 880 may be spaced apart from each other and may be electrically disconnected from each other. The third conductive terminal 810 may be electrically connected to a corresponding one of the under-bump patterns 120 through one of the solder connecting portions 880. For example, the third conductive terminal 810 may be electrically connected to one of the outer connection terminals 800 through the first redistribution substrate 100. One of the outer connection terminals 800 may be a power solder ball. Thus, a voltage may be applied to the third conductive terminal 810. The voltage may be a ground voltage or a power voltage.

The fourth conductive terminal 820 may be electrically connected to the first redistribution substrate 100 through another of the solder connecting portions 880. In detail, the fourth conductive terminal 820 may be electrically connected to a corresponding one of the first redistribution pads 150 through the first redistribution patterns 130. Accordingly, an external voltage may be applied to the second passive device 700 through the outer connection terminal 800, and a voltage that is output from the second passive device 700, may be transferred to the first redistribution pad 150, which is electrically connected thereto.

According to an embodiment, the first semiconductor chip 200 may be disposed on the first redistribution substrate 100, and the first passive device 500 may be disposed on the first semiconductor chip 200. The first passive device 500 may be coupled to the first terminal wiring patterns 630*a* of the second redistribution substrate 600, which is provided on the first semiconductor chip 200, and which may be electrically connected to the first semiconductor chip 200. As a result, it may be possible to supply a voltage from the first passive device 500 to the first semiconductor chip 200. Thus, the number of the passive devices that are used to supply the voltage to the first semiconductor chip 200 may be increased, and thus it may be possible to improve electrical characteristics of the semiconductor package 10.

In addition, since the first passive device 500 is provided on the first semiconductor chip 200, and not under the bottom surface of the first redistribution substrate 100, it may be possible to reduce the number of the second passive devices 700 attached to the bottom surface of the first redistribution substrate 100. As a result, it may be possible to increase the number of the outer connection terminals 800 provided on the bottom surface of the first redistribution substrate 100 and thereby it may be possible to reduce a mechanical stress that is exerted on each of the outer connection terminals 800 when the semiconductor package 10 is mounted on a main board. Thus, it may be possible to improve the mechanical reliability of the semiconductor package 10.

In addition, the first insulating pattern 550, which includes a PID material, may cover the first passive device 500. Thus, it may be possible to improve a warpage property of the semiconductor package 10 in a process that is performed after the formation of the first passive device 500.

Referring to FIGS. 1 and 2A, the first passive device 500 may be spaced apart from the first mold layer 400 by a first distance L1. In detail, the first distance L1 may be a distance from a side surface of the first mold layer 400, which defines the first opening 400H1, to a side surface of the first passive device 500 in the first direction D1. The first distance L1 may range from 5 μm to 100 μm.

Each of the first terminal wiring patterns 630*a* may include a third via portion 630*a*V and a third line portion 630*a*L. The third via portion 630*a*V may be provided in a corresponding one of the second insulating layers 601. The third line portion 630*a*L may be provided on the third via portion 630*a*V and may be connected to the third via portion 630*a*V without any interface therebetween. A width of the third line portion 630*a*L may be larger than a width of the third via portion 630*a*V. The third line portion 630*a*L may extend to a region on a top surface of a corresponding one of the first insulating layers 101.

For example, each of the first seed terminal patterns 635*a* may cover bottom and side surfaces of the third via portion 630*a*V and a bottom surface of the third line portion 630*a*L. The first seed terminal patterns 635*a* may not extend into a region on a side surface of the third line portion 630*a*L of the first terminal wiring pattern 630*a* corresponding thereto.

The largest width of the third via portion 630*a*V may be a first width W1. The first width W1 may range from 50 μm to 150 μm. The third via portion 630*a*V may have a third height H3. The third height H3 may range from 3 μm to 15 μm.

Figure 2B:
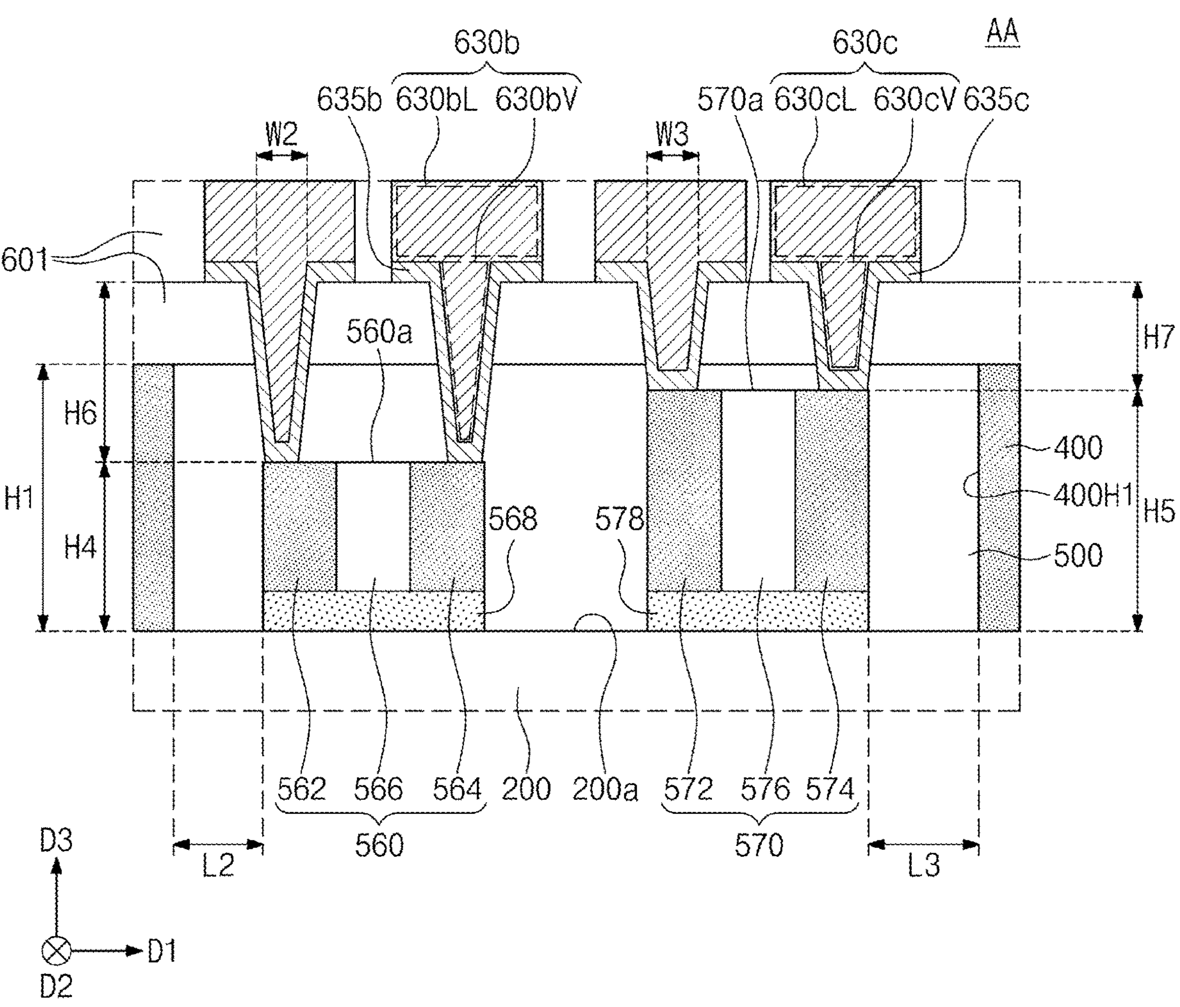
FIG. 2B is an enlarged sectional view illustrating the portion 'AA' of FIG. 1, according to an embodiment.

FIG. 2B is an enlarged sectional view illustrating the portion 'AA' of FIG. 1, according to an embodiment. Except for features to be described below, the semiconductor package in the present embodiment may have substantially the same features as those described with reference to FIGS. 1 and 2A Thus, an overlapping description thereof may not be repeated.

Referring to FIG. 2B, a third passive device 560 and a fourth passive device 570 may be provided in the first opening 400H1 of the first mold layer 400. The third and fourth passive devices 560 and 570 may correspond to the first passive device 500 of FIG. 1.

The third passive device 560 may include a fifth conductive terminal 562, a sixth conductive terminal 564, and a third insulating material 566. Each of the fifth and sixth conductive terminals 562 and 564 may be an electrode of the third passive device 560. The sixth conductive terminal 564 may be spaced apart from the fifth conductive terminal 562. The third insulating material 566 may be provided between the fifth conductive terminal 562 and the sixth conductive terminal 564. A second adhesive film 568 may be provided between the third passive device 560 and the first semiconductor chip 200. The second adhesive film 568 may correspond to the first adhesive film 540.

The fourth passive device 570 may include a seventh conductive terminal 572, an eighth conductive terminal 574, and a fourth insulating material 576. Each of the seventh and eighth conductive terminals 572 and 574 may be an electrode of the fourth passive device 570. The eighth conductive terminal 574 may be spaced apart from the seventh conductive terminal 572. The fourth insulating material 576 may be provided between the seventh conductive terminal 572 and the eighth conductive terminal 574. A third adhesive film 578 may be provided between the fourth passive device 570 and the first semiconductor chip 200. The third adhesive film 578 may correspond to the first adhesive film 540.

The third passive device 560 may have a fourth height H4. The fourth height H4 may be a distance from the top surface 200*a* of the first semiconductor chip 200 to a top surface 560*a* of the third passive device 560 in the third direction D3. The fourth height H4 may be smaller than or equal to the first height H1.

The fourth passive device 570 may have a fifth height H5. The fifth height H5 may be a distance from the top surface 200*a* of the first semiconductor chip 200 to a top surface 570*a* of the fourth passive device 570 in the third direction D3. The fifth height H5 may be smaller than or equal to the first height H1.

The fourth height H4 and the fifth height H5 may be different from each other depending on the desired design of the semiconductor package.

The second redistribution substrate 600 may include second terminal wiring patterns 630*b* and third terminal wiring patterns 630*c*. The second terminal wiring patterns 630*b* and the third terminal wiring patterns 630*c* may correspond to the first terminal wiring patterns 630*a*. The second terminal wiring patterns 630*b* may be provided on the third passive device 560 and may be coupled to the fifth conductive terminal 562 and the sixth conductive terminal 564. The third terminal wiring patterns 630*c* may be provided on the fourth passive device 570 and may be coupled to the seventh conductive terminal 572 and the eighth conductive terminal 574. The second terminal wiring patterns 630*b* may include a fourth via portion 630*b*V and a fourth line portion 630*b*L. The third terminal wiring patterns 630*c* may include a fifth via portion 630*c*V and a fifth line portion 630*c*L. The largest widths of the fourth and fifth via portions 630*b*V and 630*c*V may be a second width W2 and a third width W3, respectively. Each of the first and second widths W1 and W2 may range from 50 μm to 150 μm. The fourth via portion 630*b*V and the fifth via portion 630*c*V may have a sixth height H6 and a seventh height H7, respectively. Each of the sixth and seventh heights H6 and H7 may range from 3 μm to 15 μm. The second terminal wiring patterns 630*b* and the third terminal wiring patterns 630*c* may be spaced apart from each other and may not be electrically connected to each other.

Second seed terminal patterns 635*b* may be disposed under bottom surfaces of the second terminal wiring patterns 630*b*, respectively. Third seed terminal patterns 635*c* may be disposed under bottom surfaces of the third terminal wiring patterns 630*c*, respectively. The second and third seed terminal patterns 635*b* and 635*c* may correspond to the first seed terminal patterns 635*a* of FIG. 1.

Figure 2C:
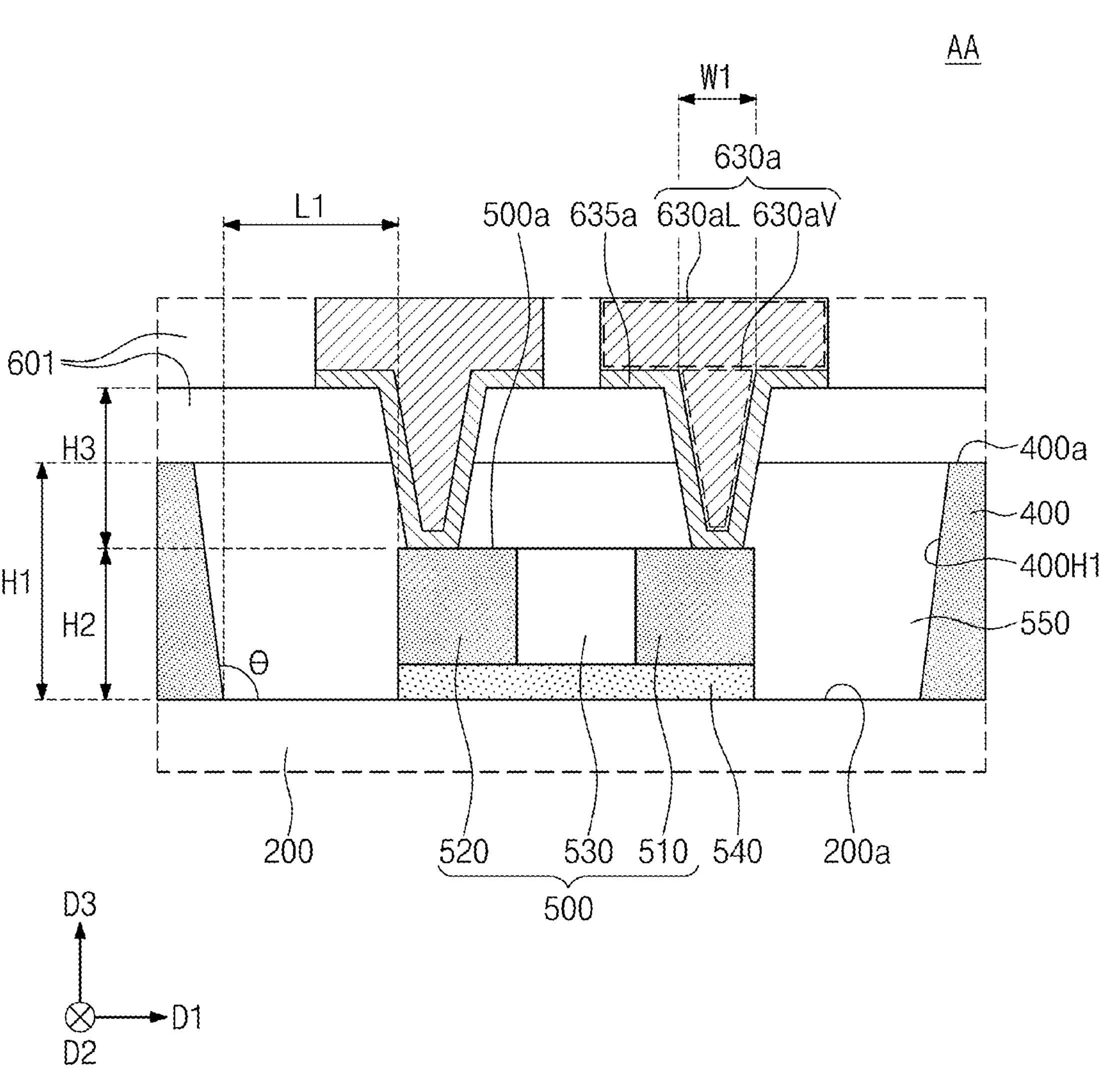
FIG. 2C is an enlarged sectional view illustrating the portion 'AA' of FIG. 1, according to an embodiment.

FIG. 2C is an enlarged sectional view illustrating the portion 'AA' of FIG. 1, according to an embodiment. Except for features to be described below, the semiconductor package in the present embodiment may have substantially the same features as those described with reference to FIGS. 1 and 2A, and thus, an overlapping description thereof will not be repeated.

Referring to FIG. 2C, an inner side surface of the first mold layer 400 defining the first opening 400H1 may be inclined at an obtuse angle θ, that is, an angle greater than 90°, to the top surface 200*a* of the first semiconductor chip 200. This structure may be formed when the first opening 400H1 of the first mold layer 400 is formed by a dry etching process.

Figure 3:
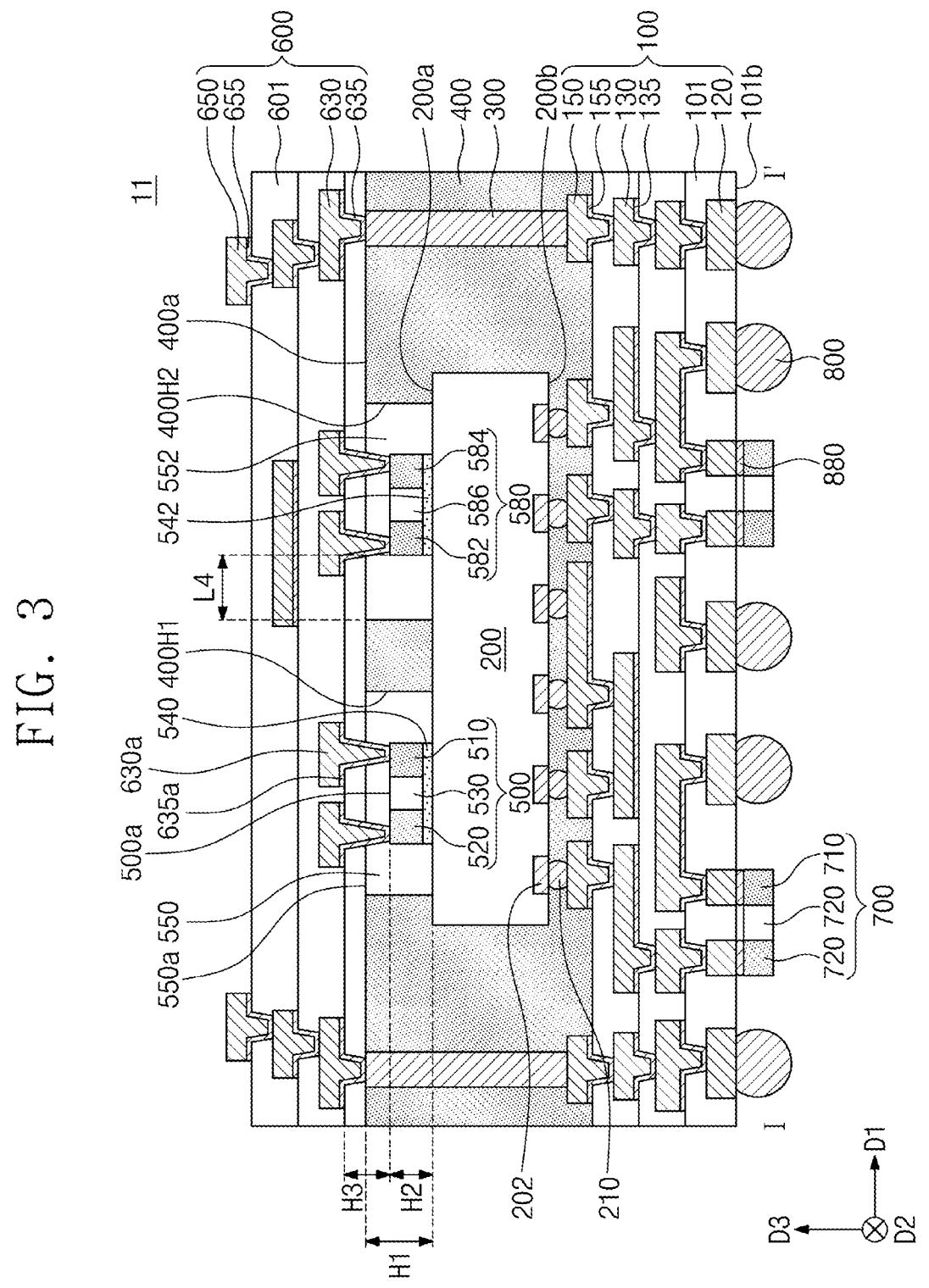

FIG. 3 is a sectional view illustrating a semiconductor package according to an embodiment. Except for features to be described below, the semiconductor package in the present embodiment may have substantially the same features as those described with reference to FIGS. 1 and 2A Thus, an overlapping description thereof will not be repeated.

Referring to FIG. 3, in a semiconductor package 11 according to the present embodiment, the first mold layer 400 may further include a second opening 400H2 that exposes another portion of the top surface 200*a* of the first semiconductor chip 200, in addition to the first opening 400H1. That is, the portion of the top surface 200*a* of the first semiconductor chip 200 may be exposed to the outside through the second opening 400H2 of the first mold layer 400. The first opening 400H1 and the second opening 400H2 may be spaced apart from each other.

A fifth passive device 580 may be provided on the top surface 200*a* of the first semiconductor chip 200 exposed by the second opening 400H2 of the first mold layer 400. In other words, the fifth passive device 580 may be provided in the second opening 400H2 of the first mold layer 400. The fifth passive device 580 may correspond to the first passive device 500. The fifth passive device 580 may include a ninth conductive terminal 582, a tenth conductive terminal 584, and a fifth insulating material 586. Each of the ninth and tenth conductive terminals 582 and 584 may be an electrode of the fifth passive device 580. The ninth conductive terminal 582 may be spaced apart from the tenth conductive terminal 584. The fifth insulating material 586 may be provided between the ninth conductive terminal 582 and the tenth conductive terminal 584. The ninth conductive terminal 582 and the tenth conductive terminal 584 may be coupled to the first terminal wiring patterns 630*a*, respectively.

A fourth adhesive film 542 may be provided between the fifth passive device 580 and the first semiconductor chip 200. The fourth adhesive film 542 may correspond to the first adhesive film 540.

A distance from a side surface of the first mold layer 400 defining the second opening 400H2 to a side surface of the fifth passive device 580 in the first direction D1 may be a fourth distance L4. The fourth distance L4 may range from 5 μm to 100 μm.

A second insulating pattern 552 may be provided in the second opening 400H2 of the first mold layer 400. The second insulating pattern 552 may cover the portion of the top surface 200*a* of the first semiconductor chip 200 exposed by the second opening 400H2. The second insulating pattern 552 may cover an inner side surface of the first mold layer 400 defining the second opening 400H2. The second insulating pattern 552 may cover top and side surfaces of the fifth passive device 580 and a side surface of the fourth adhesive film 542. A top surface of the second insulating pattern 552 may be located at a level that is higher than or equal to a top surface of the fifth passive device 580. The top surface of the second insulating pattern 552 may be located at the same vertical level as the top surface 400*a* of the first mold layer 400. The second insulating pattern 552 may be formed of or include at least one of photo-imageable dielectric (PID) materials.

For convenience of illustration, the second insulating pattern 552 and the lowermost one of the second insulating layers 601 are illustrated as forming an observable interface therebetween, but the second insulating pattern 552 and the lowermost one of the second insulating layers 601 may be formed to constitute a single object. In this case, the lowermost one of the second insulating layers 601 may be formed of or include the same material as the second insulating pattern 552.

Figure 4:
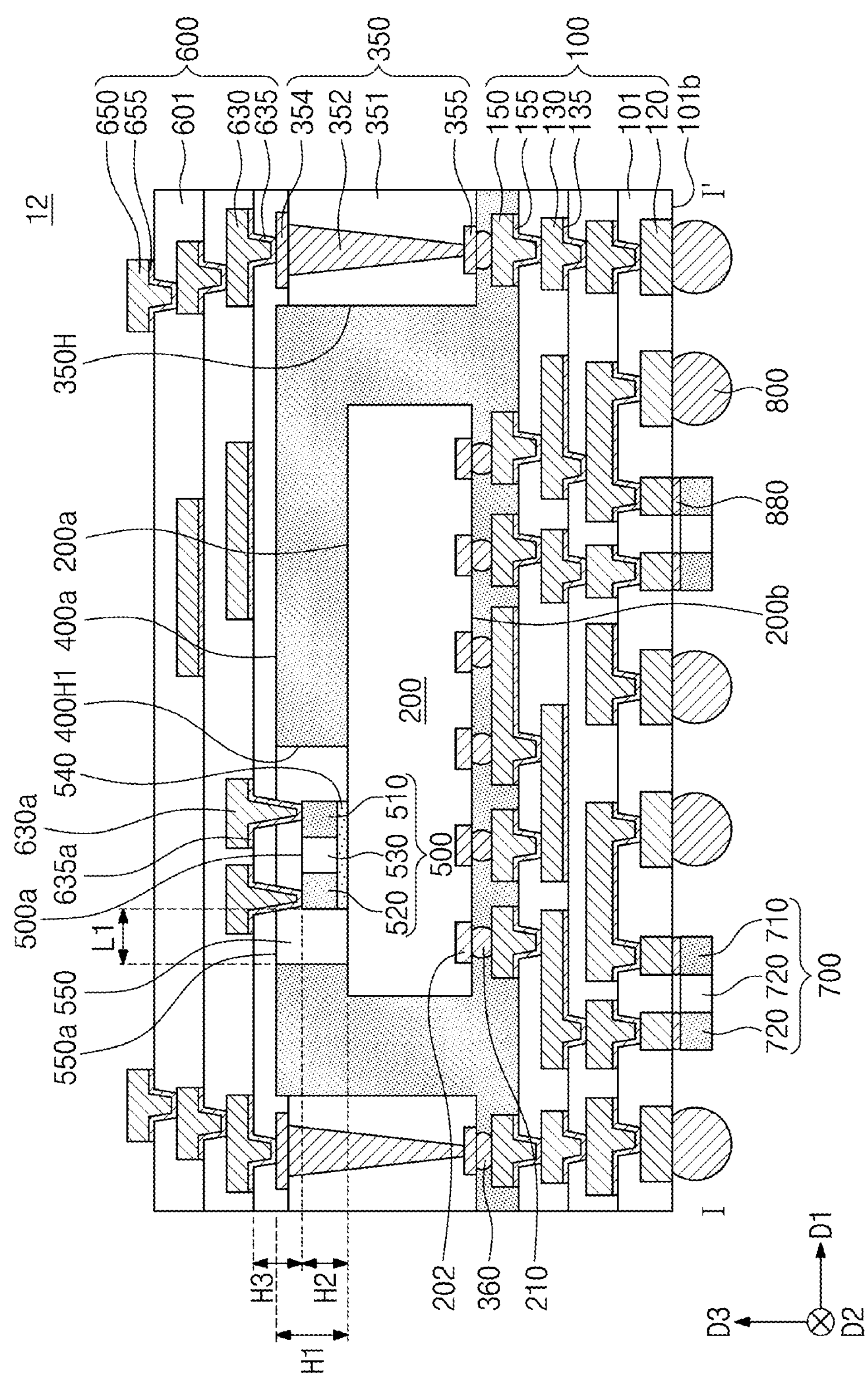
FIG. 4 is a sectional view illustrating a semiconductor package according to an embodiment.

FIG. 4 is a sectional view illustrating a semiconductor package according to an embodiment. Except for features to be described below, the semiconductor package in the present embodiment may have substantially the same features as those described with reference to FIGS. 1 and 2A, and thus, an overlapping description thereof will no be repeated.

Referring to FIG. 4, a semiconductor package 12 may include a connection substrate 350, instead of the conductive post 300 of FIG. 1. The connection substrate 350 may include a base layer 351, a vertical conductive structure 352, an upper connection pad 354, and a lower connection pad 355. The connection substrate 350 may include a penetration hole 350H.

The base layer 351 may be provided on the first redistribution substrate 100. The base layer 351 may be spaced apart from the first semiconductor chip 200. For example, the base layer 351 may be formed of or include at least one of insulating resins. In an embodiment, the base layer 351 may be formed of or include at least one of polyhydroxystyrene (PHS), polybenzoxazole (PBO), or polypropylene glycol (PPG).

The vertical conductive structure 352 may be provided to penetrate the base layer 351. The upper connection pad 354 may be provided on a top surface of the base layer 351. For convenience of illustration, the vertical conductive structure 352 and the upper connection pad 354 are illustrated to form an observable interface therebetween. In some implementations, the vertical conductive structure 352 and the upper connection pad 354 may be formed to constitute a single object. In this case, the vertical conductive structure 352 and the upper connection pad 354 may be formed of or include the same material. However, the embodiments are not limited to this example, and the structure used may depend on the desired design of the semiconductor package. The upper connection pad 354 may be electrically connected to a corresponding one of the second redistribution patterns 630.

The lower connection pad 355 may be provided on a bottom surface of the base layer 351. The lower connection pad 355 may be connected to a corresponding one of the first redistribution pads 150. The vertical conductive structure 352 may connect the upper connection pad 354 to the lower connection pad 355. Each of the vertical conductive structure 352, the upper connection pad 354, and the lower connection pad 355 may be formed of or include at least one of metallic materials (e.g., copper and aluminum).

The semiconductor package 12 may further include a second connection terminal 360. The second connection terminal 360 may be interposed between the connection substrate 350 and the first redistribution substrate 100 and may electrically connect the connection substrate 350 to the first redistribution substrate 100. The second connection terminal 360 may be in contact with the lower connection pad 355 of the connection substrate 350 and may be in contact with a corresponding one of the first redistribution pads 150 of the first redistribution substrate 100. The second connection terminal 360 may be formed of or include at least one of solder materials. The solder materials may include, for example, tin, bismuth, lead, silver, or alloys thereof.

The first semiconductor chip 200 may be provided in the penetration hole 350H, when viewed in a plan view. That is, the connection substrate 350 may enclose the first semiconductor chip 200, when viewed in a plan view.

The first mold layer 400 may be interposed between the first semiconductor chip 200 and the connection substrate 350. The first mold layer 400 may extend to a bottom surface of the connection substrate 350 to enclose a side surface of the second connection terminal 360. The first mold layer 400 may be provided to hermetically seal the second connection terminal 360. In some implementations, an under-fill pattern (not shown) may be interposed between the connection substrate 350 and the first redistribution substrate 100.

A semiconductor package 14 may be a fan-out panel level package (FOPLP), as a non-limiting example.

Figure 5:
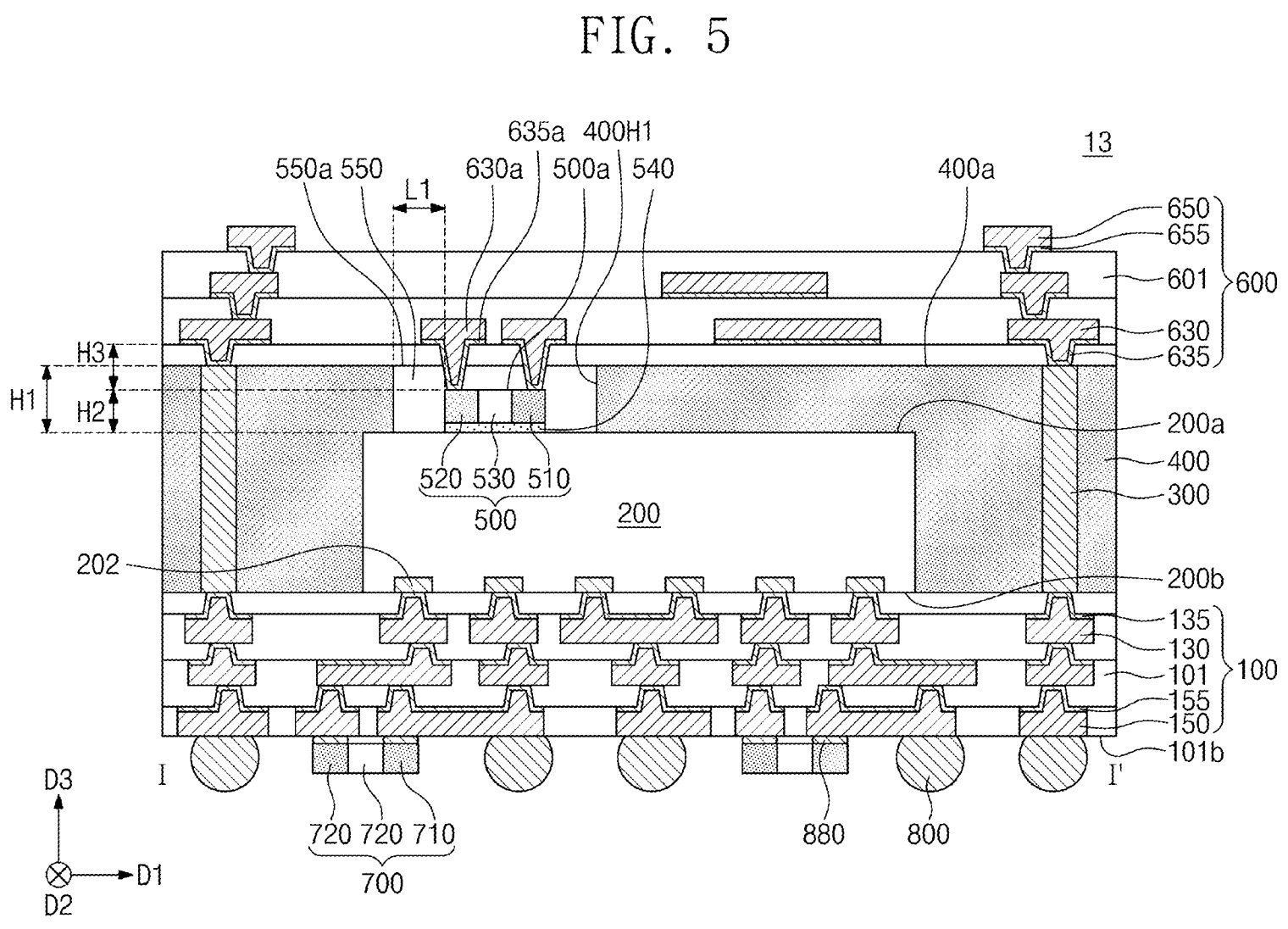

FIG. 5 is a sectional view illustrating a semiconductor package according to an embodiment. Except for features to be described below, the semiconductor package in the present embodiment may have substantially the same features as those described with reference to FIGS. 1 and 2A, and thus, an overlapping description thereof will not be repeated.

Referring to FIG. 5, the first semiconductor chip 200 of a semiconductor package 13 may be in direct contact with the first redistribution substrate 100. Here, the first connection terminal 210 shown in FIG. 1 may be omitted.

The first redistribution substrate 100 may include the first insulating layers 101, the first redistribution patterns 130, the first seed patterns 135, the first seed pads 155, and the first redistribution pads 150. In some implementations, the first redistribution substrate 100 may include the under-bump patterns 120 of FIG. 1. The uppermost one of the first insulating layers 101 may be in direct contact with the bottom surface 200*b* of the first semiconductor chip 200.

The first seed patterns 135 may be provided on top surfaces of the first redistribution patterns 130, respectively. The first seed patterns 135 in the uppermost one of the first insulating layers 101 may be in contact with the first chip pad 202, which is provided on the bottom surface 200*b* of the first semiconductor chip 200. For example, the first via portion in each of the uppermost one of the first redistribution patterns 130 may be vertically overlapped with the first chip pad 202.

The outer connection terminals 800 may be disposed on the bottom surfaces of the first redistribution pads 150. The first redistribution pads 150 may serve as the pads of the outer connection terminals 800.

The semiconductor package 13 may be fabricated by a chip-first process, as a non-limiting example.

Figure 6:
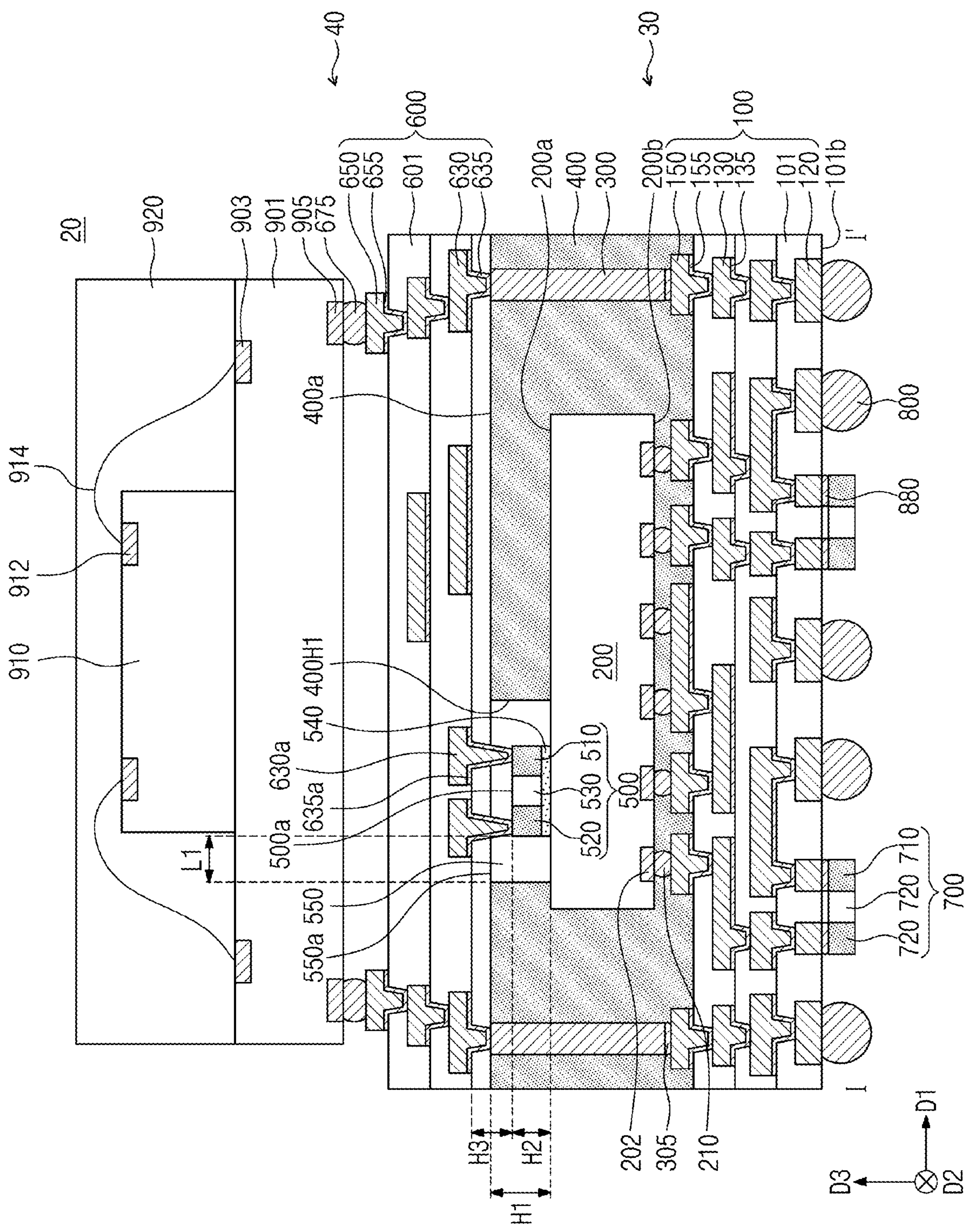
FIG. 6 is a sectional view illustrating a semiconductor package according to an embodiment.

FIG. 6 is a sectional view illustrating a semiconductor package 20 according to an embodiment.

Referring to FIG. 6, the semiconductor package 20 may include a lower package 30 and an upper package 40 on the lower package 30. The lower package 30 may be substantially the same as the semiconductor package 10 in the embodiment of FIG. 1. For example, the lower package 30 may include the first redistribution substrate 100, the first semiconductor chip 200, the conductive post 300, the first mold layer 400, the first passive device 500, the first insulating pattern 550, the second redistribution substrate 600, the second passive device 700, and the outer connection terminals 800. As another example, the lower package 30 may be substantially the same as the semiconductor package 11 of FIG. 3, the semiconductor package 12 of FIG. 4, or the semiconductor package 13 of FIG. 5.

The upper package 40 may include a package substrate 901, a second semiconductor chip 910, and a second mold layer 920.

The package substrate 901 may include a printed circuit board (PCB) or a redistribution substrate. An upper package pad 903 and a lower package pad 905 may be respectively provided on top and bottom surfaces of the package substrate 901. In an embodiment, a plurality of upper package pads 903 and a plurality of lower package pads 905 may be provided. The upper and lower package pads 903 and 905 may be electrically connected to each other by circuit lines in the package substrate 901. Each of the upper and lower package pads 903 and 905 may be formed of or include at least one of metallic materials (e.g., copper and aluminum).

A third connection terminal 675 may be provided between the lower package pad 905 and a corresponding one of the second redistribution pads 650. The third connection terminal 675 may electrically connect the package substrate 901 to the second redistribution substrate 600 through the lower package pad 905 and the second redistribution pads 650. The third connection terminal 675 may be formed of or include at least one of solder materials. For example, the solder materials may include tin, bismuth, lead, silver, or alloys thereof.

The second semiconductor chip 910 may be disposed on a top surface of the package substrate 901. A second chip pad 912 may be provided on a top surface of the second semiconductor chip 910. In an embodiment, a plurality of second chip pads 912 may be provided. A bonding wire 914 may be provided to connect the second chip pad 912 to the upper package pad 903. The second chip pad 912 and the bonding wire 914 may be formed of or include at least one of metallic materials (e.g., copper and aluminum).

The second mold layer 920 may be provided on the package substrate 901. The second mold layer 920 may cover at least a portion of the top surface of the package substrate 901 and at least a portion of the second semiconductor chip 910. The second mold layer 920 may cover the bonding wire 914. The second mold layer 920 may be formed of or include an insulating polymer (e.g., epoxy molding compound).

FIGS. 7 to 11 are sectional views illustrating a method of fabricating a semiconductor package, according to an embodiment.

Figure 7:
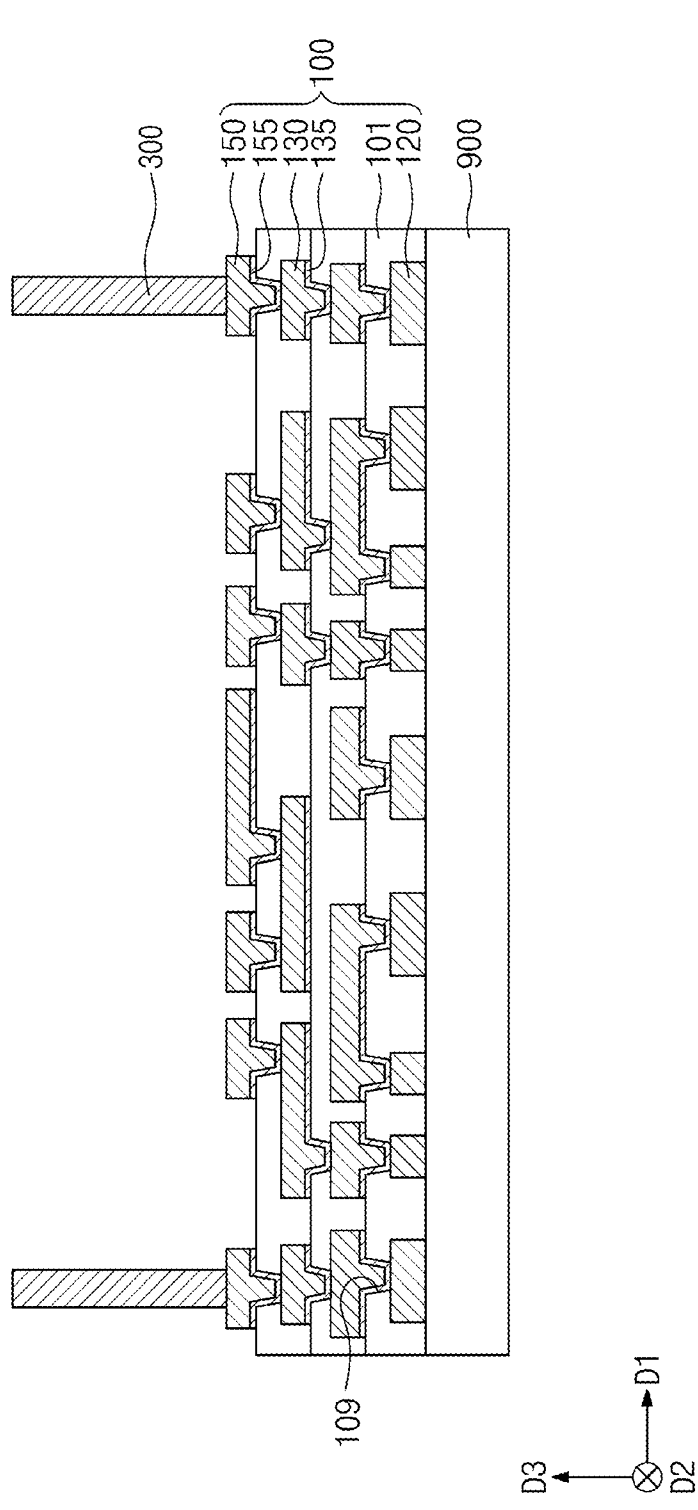

Referring to FIG. 7, the under-bump patterns 120, the first insulating layer 101, the first seed patterns 135, and the first redistribution patterns 130 may be formed on a carrier substrate 900.

In an embodiment, the under-bump patterns 120 may be formed on the carrier substrate 900 using, for example, an electroplating process. The first insulating layer 101 may be formed on the carrier substrate 900 to cover side and top surfaces of the under-bump patterns 120. Openings 109 may be formed in the first insulating layer 101 to expose the under-bump patterns 120.

A seed conductive layer may be conformally formed in the openings 109 and on top surface of the first insulating layer 101. An electroplating process using the seed conductive layer as an electrode may be performed to form the first redistribution patterns 130. The first redistribution patterns 130 may be formed in the openings 109 and on the top surface of the first insulating layer 101 to cover a portion of the seed conductive layer. Each of the first redistribution patterns 130 may include a first via portion and a first line portion. The first via portion may be formed in a corresponding one of the openings 109. The first line portion may be formed on the first via portion and may be extended to a region on the top surface of the first insulating layer 101. An etching process using the first redistribution patterns 130 as an etch mask may be performed on the seed conductive layer to form the first seed patterns 135.

The steps of forming the first insulating layer 101, the first seed patterns 135, and the first redistribution patterns 130 may be repeatedly performed. Accordingly, the stacked first insulating layers 101 and the stacked first redistribution patterns 130 may be formed.

The first redistribution pads 150 may be formed in the openings 109 of the uppermost one of the first insulating layers 101 and may be coupled to the first redistribution patterns 130. The formation of the first redistribution pads 150 may include conformally forming a seed conductive layer in the openings 109 of the uppermost one of the first insulating layers 101 and on the top surface of the first insulating layer 101, forming a first photoresist pattern on the seed conductive layer, and performing an electroplating process using the seed conductive layer as an electrode.

After the removal of the first photoresist pattern, a second photoresist pattern may be formed to expose the first redistribution pads 150. The second photoresist pattern may include openings defining spaces, in which the conductive posts 300 will be formed.

The conductive posts 300 may be formed on the first redistribution pads 150 and in the openings of the second photoresist pattern. The conductive posts 300 may be formed by performing an electroplating process using the seed conductive layer as an electrode. However, the conductive posts 300 may not be formed on the first redistribution pads 150, which are formed in a center region of the first redistribution substrate 100.

The second photoresist pattern may be removed, and then, an etching process using the first redistribution pads 150 as an etch mask may be performed on the seed conductive layer to form the first seed pads 155. Accordingly, the first redistribution substrate 100 may be fabricated.

Figure 8:
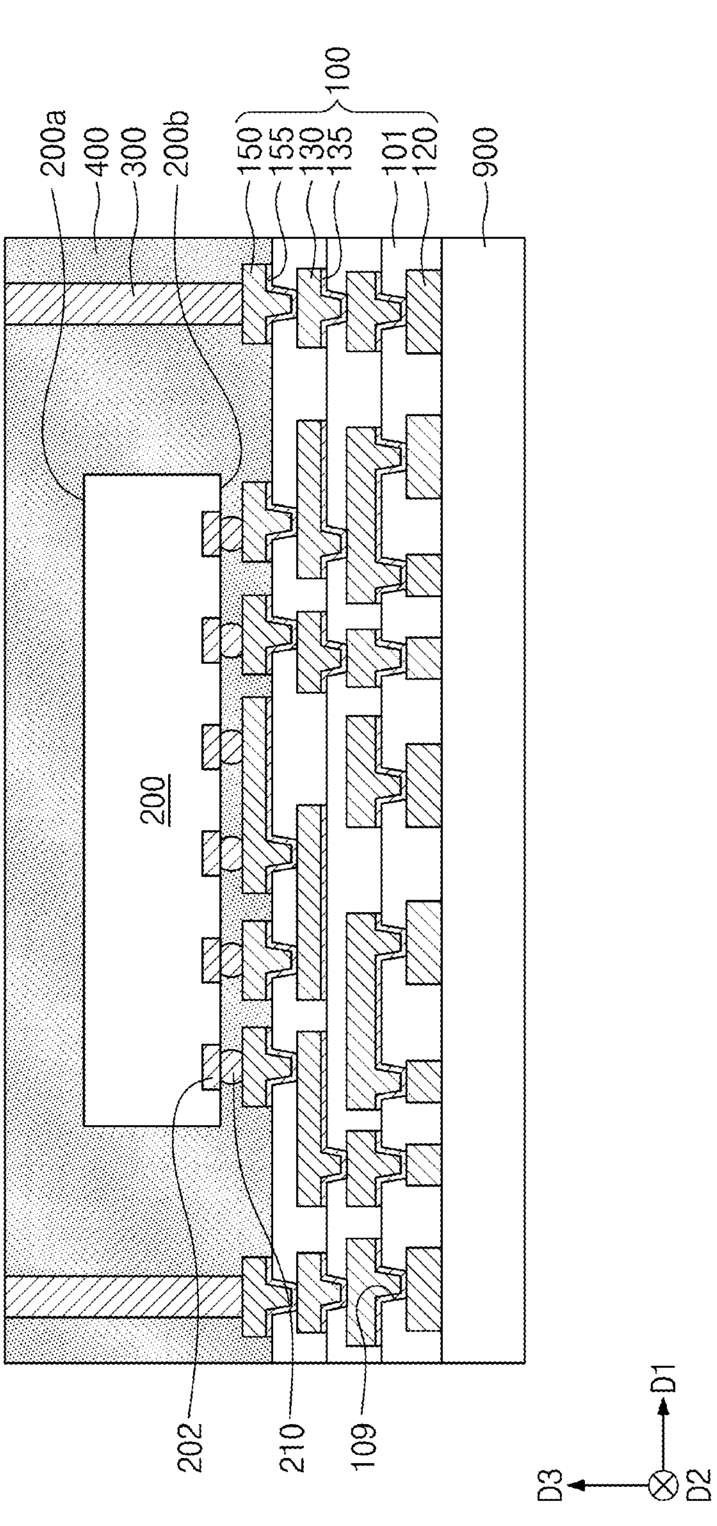

Referring to FIG. 8, the first semiconductor chip 200 may be mounted on the first redistribution substrate 100 such that the first chip pad 202 of the first semiconductor chip 200 faces the first redistribution substrate 100. The first mold layer 400 may be formed on a top surface of the first redistribution substrate 100 to at least partially cover the first redistribution substrate 100, the first semiconductor chip 200, and the conductive posts 300. The first mold layer 400 may cover the top surface 200*a* of the first semiconductor chip 200 and the top surfaces of the conductive posts 300. A top surface of the first mold layer 400 may be higher than the top surface 200*a* of the first semiconductor chip 200 and the top surfaces of the conductive posts 300. The first mold layer 400 may be extended to the bottom surface 200*b* of the first semiconductor chip 200 to hermetically seal the first connection terminal 210.

A planarization process may be performed on the first mold layer 400 to expose the top surfaces of the conductive posts 300. For example, the planarization process may include a chemical mechanical polishing (CMP) process. After the planarization process, the exposed top surfaces of the conductive posts 300 may be placed at substantially the same level as the top surface of the first mold layer 400. The top surface 200*a* of the first semiconductor chip 200 may be covered with the first mold layer 400.

Figure 9:
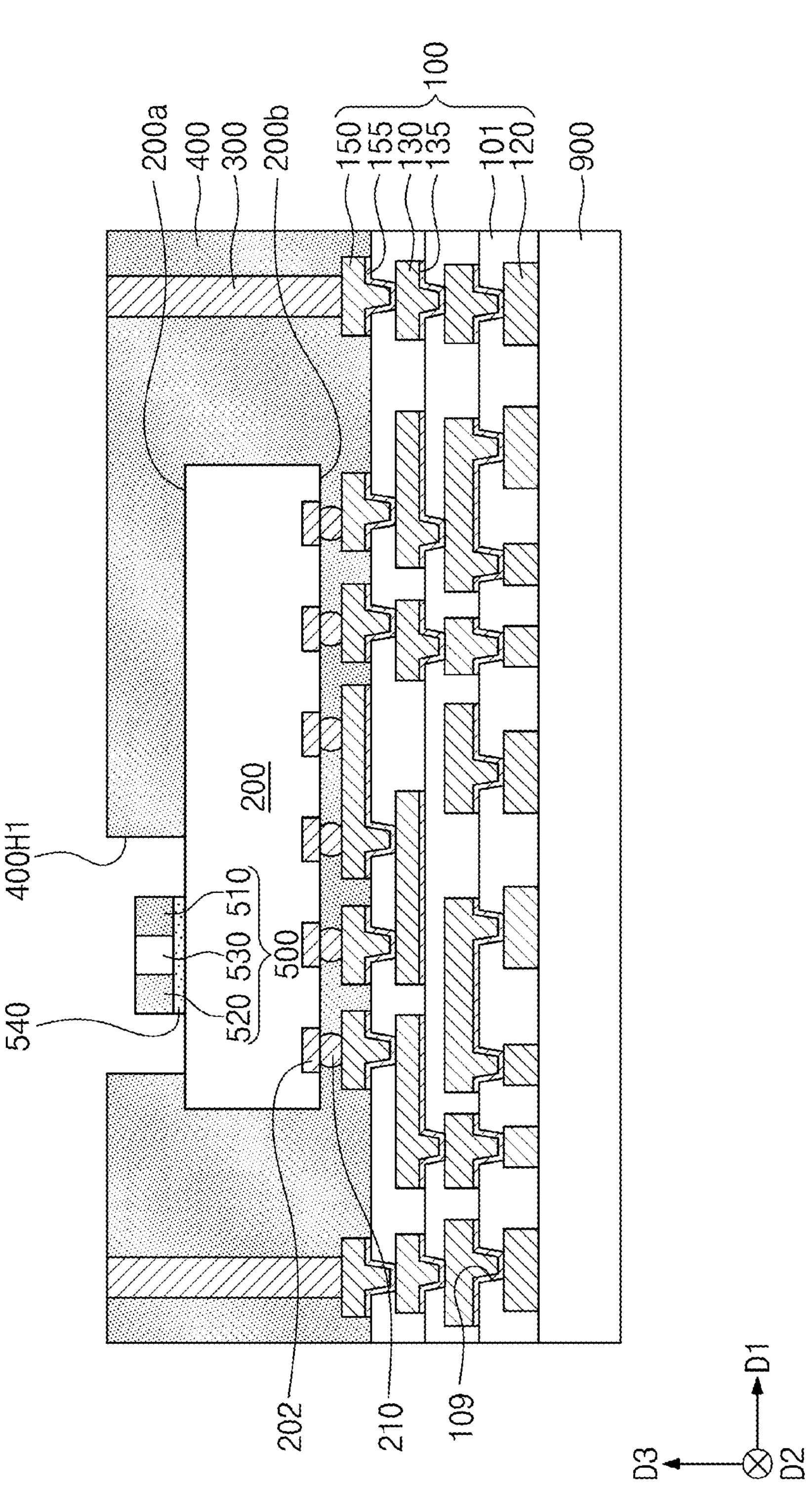

Referring to FIG. 9, the first opening 400H1 may be formed in the first mold layer 400 to expose at least a portion of the top surface 200*a* of the first semiconductor chip 200. The formation of the first opening 400H1 may include forming a photoresist material on the first mold layer 400, performing exposing and developing processes on the photoresist material, performing a strip process to remove a portion of the photoresist material from a region that is vertically overlapped with the first opening 400H1, performing a dry etching process using the photoresist material as an etch mask to expose the top surface 200*a* of the first semiconductor chip 200, and removing the photoresist material.

The first passive device 500 may be mounted on the top surface 200*a* of the first semiconductor chip 200 exposed by the first opening 400H1 of the first mold layer 400. For example, the first passive device 500 may be placed in the first opening 400H1 of the first mold layer 400. Before the mounting of the first passive device 500, the first adhesive film 540 may be attached to a bottom surface of the first passive device 500. The mounting of the first passive device 500 may be performed using a pick-and-place process.

Figure 10:
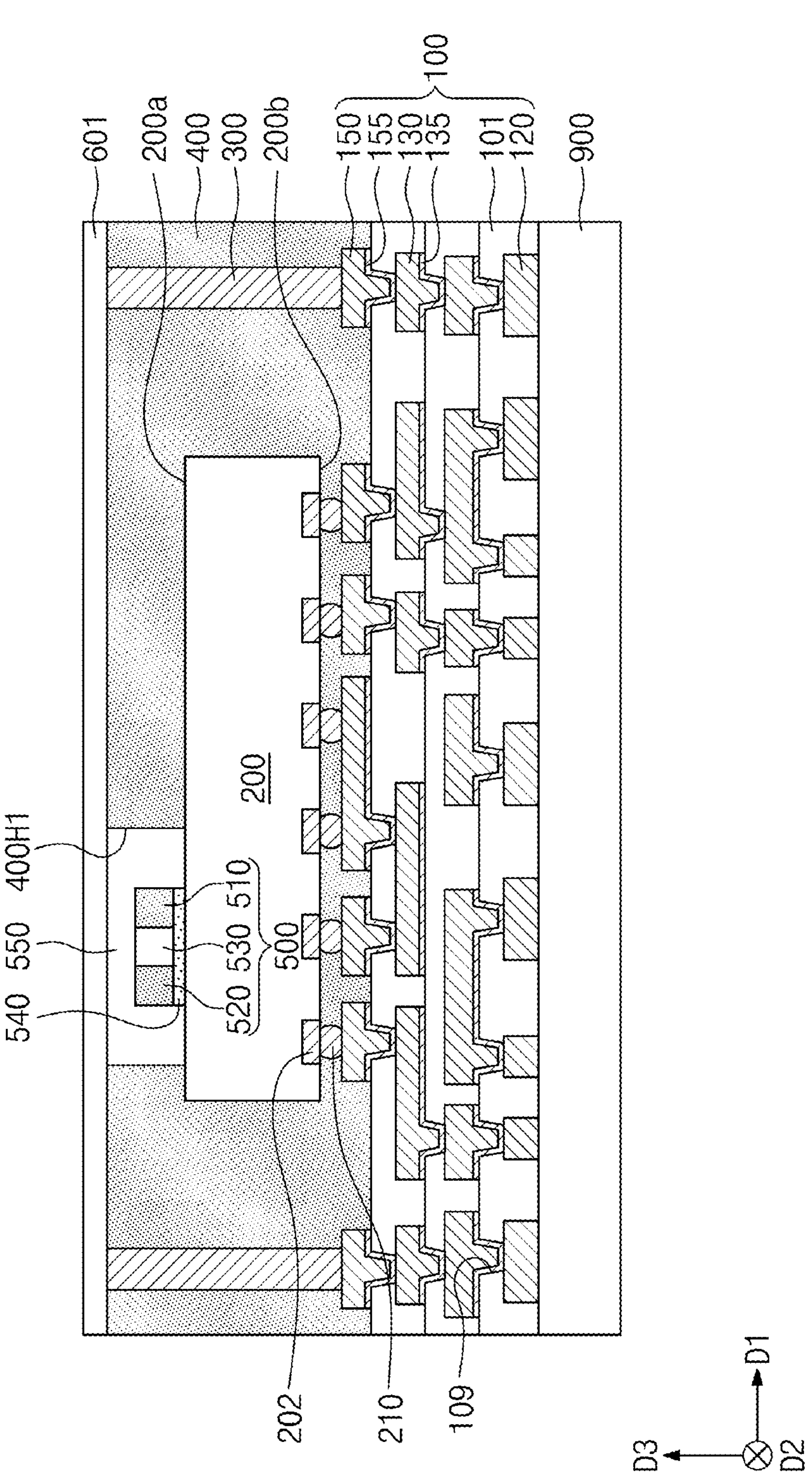

Referring to FIG. 10, the first insulating pattern 550 may be formed in the first opening 400H1 of the first mold layer 400. The first insulating pattern 550 may cover the portion of the top surface 200*a* of the first semiconductor chip 200 exposed by the first opening 400H1. The first insulating pattern 550 may cover an inner side surface of the first mold layer 400 defining the first opening 400H1. The first insulating pattern 550 may cover the top surface 500*a* and the side surface of the first passive device 500 and the side surface of the first adhesive film 540. The lowermost one of the second insulating layers 601 of FIG. 1 may be formed on the conductive posts 300, the first mold layer 400, and the first insulating pattern 550. The first insulating pattern 550 and the lowermost one of the second insulating layers 601 may be formed using a coating method (e.g., a slit coating method or a spin coating method).

For convenience in illustration, the first insulating pattern 550 and the lowermost one of the second insulating layers 601 are illustrated to form an observable interface therebetween, but the first insulating pattern 550 and the lowermost one of the second insulating layers 601 may be formed to constitute a single object. For example, the first insulating pattern 550 and the lowermost one of the second insulating layers 601 may be formed at the same time using one coating process.

Figure 11:
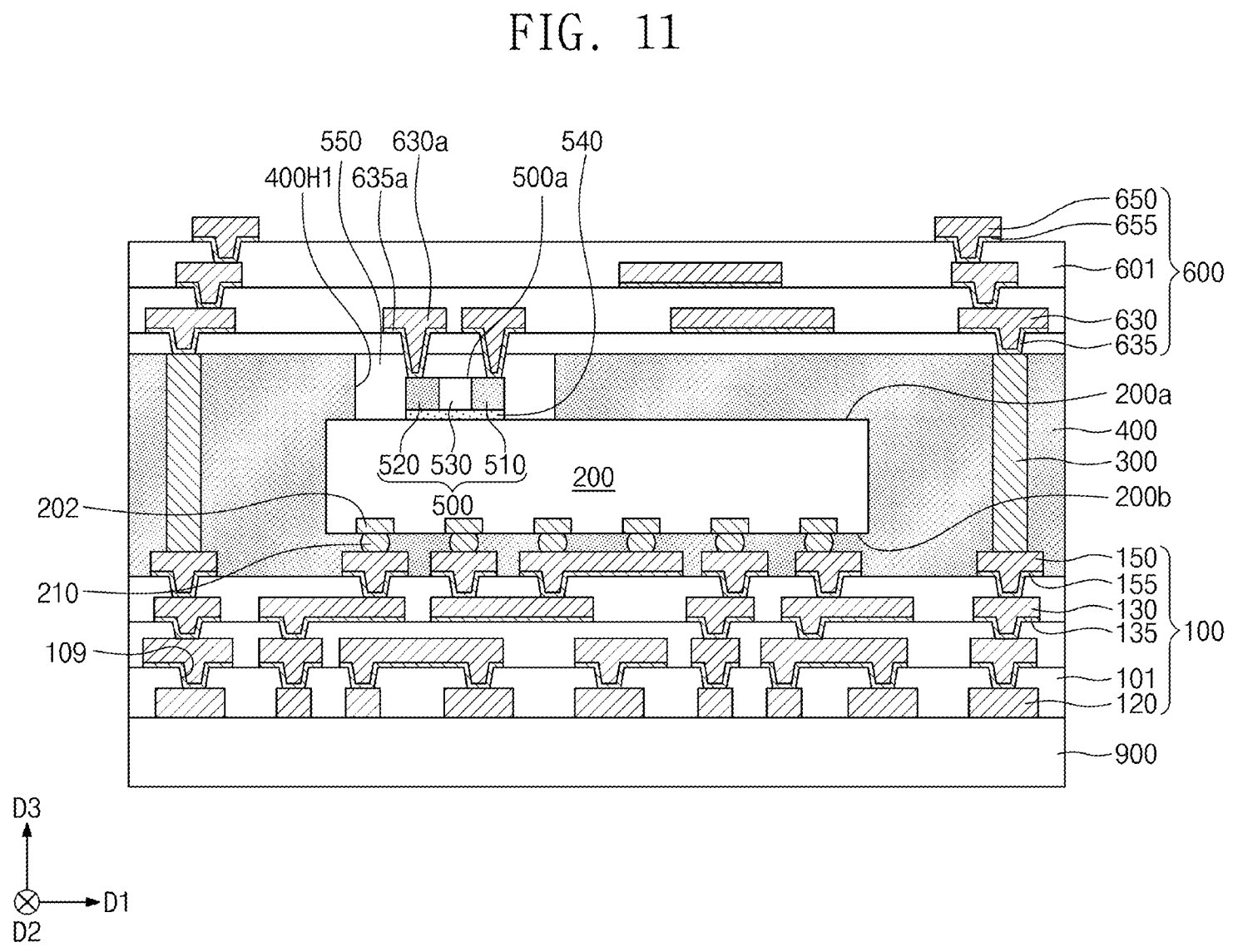

Referring to FIG. 11, the others of the second insulating layers 601, the second seed patterns 635, the second redistribution patterns 630, the second seed pads 655, and the second redistribution pads 650 may be formed on the first mold layer 400 and the conductive posts 300 to fabricate the second redistribution substrate 600.

In an embodiment, openings may be formed in the second insulating layer 601 to expose the top surfaces of the conductive posts 300, respectively. Furthermore, the openings may be formed in the second insulating layer 601 and in the first insulating pattern 550 to expose a top surface of the first conductive terminal 510 of the first passive device 500 and a top surface of the second conductive terminal 520.

A seed conductive layer may be conformally formed in the openings and on a top surface of the second insulating layer 601. The second redistribution patterns 630 and the first terminal wiring patterns 630*a* may be formed in the openings and on the top surface of the second insulating layer 601 to cover the seed conductive layer. Each of the second redistribution patterns 630 may include a second via portion and a second line portion. The first terminal wiring patterns 630*a* may include the third via portion 630*a*V and the third line portion 630*a*L, as shown in FIG. 2A. The second via portion and the third via portion 630*a*V may be formed in a corresponding one of the openings. The second line portion may be formed on the second via portion and may be extended to a region on the top surface of the second insulating layer 601. The third line portion 630*a*L may be formed on the third via portion 630*a*V and may be extended to a region on the top surface of the second insulating layer 601. Thereafter, an etching process using the second redistribution patterns 630 and the first terminal wiring patterns 630*a* as an etch mask may be performed on the seed conductive layer to form the second seed patterns 635 and the first seed terminal patterns 635*a*. The steps of forming the second insulating layer 601, the second seed patterns 635, and the second redistribution pattern 630 may be repeatedly performed. Accordingly, the stacked second insulating layers 601 and the stacked second redistribution patterns 630 may be formed.

The second redistribution pads 650 may be formed in the uppermost one of the second insulating layers 601 and on a top surface of the uppermost one of the second insulating layers 601. A seed conductive layer may be formed, before the formation of the second redistribution pads 650. The second redistribution pads 650 may be formed by an electroplating process, in which the seed conductive layer is used as an electrode. Thereafter, an etching process using the second redistribution pads 650 as an etch mask may be performed on the seed conductive layer to form the second seed pads 655. Accordingly, the second redistribution substrate 600 may be fabricated.

According to an embodiment, the first passive device 500 may be mounted in the first opening 400H1 of the first mold layer 400, and the first insulating pattern 550, which fills the first opening 400H1 and covers the first passive device 500, may be formed when the lowermost one of the second insulating layers 601 is formed. In addition, the formation of the first terminal wiring patterns 630*a*, which are coupled to the first and second conductive terminals 510 and 520 of the first passive device 500, may include forming openings to penetrate the second insulating layer 601 and at least a portion of the first insulating pattern 550 using processes of coating, exposing, developing, and curing a photo-sensitive insulating material, without an etching process. Thus, it may be possible to reduce a process difficulty, compared to the process of etching the first mold layer 400 using a laser drilling method. This may make it possible to reduce cost in a process of fabricating the semiconductor package 10.

Referring back to FIG. 1, the carrier substrate 900 may be removed to expose the bottom surface 101*b* of the first redistribution substrate 100. For example, the bottom surface of the lowermost one of the first insulating layers 101 and the bottom surfaces of the under-bump patterns 120 may be exposed.

The outer connection terminals 800 may be respectively formed on and coupled to the under-bump patterns 120. The second passive devices 700 may be respectively formed on and coupled to the bottom surfaces of the under-bump patterns 120. The semiconductor package 10 according to an embodiment of the inventive concept may be fabricated through the afore-described process.

According to an embodiment, a semiconductor package may include a first redistribution substrate, a first semiconductor chip on the first redistribution substrate, a first passive device on a top surface of the first semiconductor chip, a second redistribution substrate provided on the first semiconductor chip and coupled to the first passive device, and second passive devices provided on a bottom surface of the first redistribution substrate. Since the first passive device is provided on the top surface of the first semiconductor chip, it may be possible to reduce the number of the second passive devices provided on the bottom surface of the first redistribution substrate. Thus, the number of outer connection terminals provided on the bottom surface of the first redistribution substrate may be increased, and thus, it may be possible to reduce a mechanical stress, which is exerted on each of the outer connection terminals when the semiconductor package is mounted on a main board. Accordingly, it may be possible to improve mechanical reliability of the semiconductor package.

In addition, the semiconductor package may further include a conductive post, which is provided on the first redistribution substrate and is spaced apart from the first semiconductor chip. The conductive post may electrically connect the first redistribution substrate to the second redistribution substrate. Thus, a voltage may be supplied from the first passive device to the first semiconductor chip through the second redistribution substrate, the conductive post, and the first redistribution substrate. In an embodiment, the number of the passive devices, which are used to supply voltages to the first semiconductor chip, may be increased, and thus, electrical characteristics of the semiconductor package may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
- a first redistribution substrate comprising first insulating layers and first redistribution patterns provided in the first insulating layers;
- a semiconductor chip on the first redistribution substrate;
- a mold layer covering the semiconductor chip and including a first opening exposing a portion of a top surface of the semiconductor chip;
- a first passive device on the portion of the top surface of the semiconductor chip exposed by the first opening;
- an insulating pattern filling the first opening and covering at least a portion of the first passive device; and
- a second redistribution substrate on the mold layer, the second redistribution substrate comprising second insulating layers and second redistribution patterns provided in the second insulating layers,
- wherein the first passive device is spaced apart from the mold layer, with the insulating pattern interposed therebetween.

2. The semiconductor package as claimed in claim 1, wherein the first passive device is spaced apart from an inner side surface of the mold layer, which defines the first opening, by a distance of 5 μm to 10 μm.

3. The semiconductor package as claimed in claim 1, wherein a height of the insulating pattern ranges from 1 μm to 20 μm.

4. The semiconductor package as claimed in claim 1, further comprising a second passive device, which is disposed on a portion of the top surface of the semiconductor chip exposed by the first opening,
- wherein the second passive device is spaced apart from the first passive device and the mold layer.

5. The semiconductor package as claimed in claim 1, wherein an inner side surface of the mold layer defining the first opening is inclined to an obtuse angle to the top surface of the semiconductor chip.

6. The semiconductor package as claimed in claim 1, further comprising an adhesive film interposed between the first passive device and the semiconductor chip,
- wherein the adhesive film includes a die attach film (DAF).

7. The semiconductor package as claimed in claim 1, wherein:
- the mold layer further includes a second opening exposing another portion of the top surface of the semiconductor chip, and
- the semiconductor package further includes a second passive device, which is disposed on the portion of the top surface of the semiconductor chip exposed by the second opening.

8. The semiconductor package as claimed in claim 1, further comprising a connection substrate, which is provided on the first redistribution substrate to enclose the semiconductor chip in a plan view,
- wherein the connection substrate includes:
- a base layer;
- a vertical conductive structure penetrating the base layer; and
- an upper connection pad and a lower connection pad, which are respectively provided on top and bottom surfaces of the vertical conductive structure,
- wherein the mold layer and the base layer are made of different materials from each other.

9. The semiconductor package as claimed in claim 1, further comprising chip pads provided on a bottom surface of the semiconductor chip, wherein the first redistribution substrate includes:

first seed patterns provided on top surfaces of the first redistribution patterns, respectively, wherein the uppermost one of the first insulating layers and the uppermost one of the first seed patterns are in contact with the chip pads.

10. The semiconductor package as claimed in claim 1, wherein the insulating pattern and the lowermost one of the second insulating layers form a single object.

11. The semiconductor package as claimed in claim 10, wherein the second redistribution substrate further includes first terminal wiring patterns coupled to the first passive device.

12. The semiconductor package as claimed in claim 1, wherein a level of a top surface of the first passive device is lower than a level of a top surface of the mold layer and a level of a top surface of the insulating pattern.

13. A semiconductor package, comprising:

a first redistribution substrate;

a semiconductor chip on the first redistribution substrate;

a mold layer covering the semiconductor chip and including an opening exposing a portion of a top surface of the semiconductor chip;

a first passive device on the portion of the top surface of the semiconductor chip exposed by the opening, the first passive device including a first conductive terminal, a second conductive terminal, and a first insulating material between the first and second conductive terminals;

an insulating pattern filling the opening and covering at least a portion of the first passive device; and a second redistribution substrate on the mold layer, wherein the second redistribution substrate includes:

insulating layers; and redistribution patterns and first terminal wiring patterns provided in the insulating layers, wherein the first and second conductive terminals are coupled to the first terminal wiring patterns, respectively.

14. The semiconductor package as claimed in claim 13, wherein:

each of the first terminal wiring patterns includes a first line portion and a first via portion, which protrudes from the first line portion toward the first passive device, each of the first and second conductive terminals is in contact with the first via portion, a height of the first via portion ranges from 3 μm to 15 μm, and the largest width of the first via portion ranges from 50 μm to 150 μm.

15. The semiconductor package as claimed in claim 13, further comprising a second passive device, which is disposed on a portion of the top surface of the semiconductor chip exposed by the opening, the second passive device is spaced apart from the first passive device, and a height of the first passive device and a height of the second passive device are different from each other.

16. The semiconductor package as claimed in claim 15, wherein the second redistribution substrate further includes second terminal wiring patterns, the second passive device includes a third conductive terminal, a fourth conductive terminal, and a second insulating material between the third and fourth conductive terminals, the third and fourth conductive terminals are in contact with the second terminal wiring patterns, respectively, and the second terminal wiring patterns are spaced apart from the first terminal wiring patterns.

17. The semiconductor package as claimed in claim 13, wherein the mold layer and the insulating pattern include different materials from each other, and the first passive device is spaced apart from the mold layer.

18. The semiconductor package as claimed in claim 13, further including an outer connection terminal and a second passive device on a bottom surface of the first redistribution substrate, wherein a level of a bottom surface of the second passive device is higher than a level of a bottom surface of the outer connection terminal.

19. A semiconductor package, comprising:

a lower package; and an upper package on the lower package, wherein the lower package includes:

a first redistribution substrate;

a first semiconductor chip on the first redistribution substrate;

a conductive post on the first redistribution substrate, the conductive post being laterally spaced apart from the first semiconductor chip;

a first mold layer covering the first semiconductor chip and including a first opening, which exposes a portion of a top surface of the first semiconductor chip;

a passive device on the portion of the top surface of the first semiconductor chip exposed by the first opening; and an insulating pattern filling the first opening of the first mold layer and covering at least a portion of the passive device, wherein the upper package includes:

a second redistribution substrate, the second redistribution substrate including redistribution patterns and terminal wiring patterns;

a second semiconductor chip on the second redistribution substrate; and a second mold layer covering the second semiconductor chip, wherein the passive device is spaced apart from the first mold layer, with the insulating pattern interposed therebetween, and the terminal wiring patterns are coupled to the passive device.

20. The semiconductor package as claimed in claim 19, wherein a level of a top surface of the insulating pattern is equal to a level of a top surface of the first mold layer.

* * * * *